(12) United States Patent
Ban et al.

(10) Patent No.: US 9,691,614 B2
(45) Date of Patent: *Jun. 27, 2017

(54) METHODS OF FORMING DIFFERENT SIZED PATTERNS

(71) Applicant: SK hynix Inc., Gyeonggi-do (KR)

(72) Inventors: Keun Do Ban, Gyeonggi-do (KR);
Jong Cheon Park, Gyeonggi-do (KR);
Jung Gun Heo, Daejeon (KR); Hong Ik Kim, Gyeonggi-do (KR); Cheol Kyu Bok, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/242,903

(22) Filed: Aug. 22, 2016

(65) Prior Publication Data

US 2016/0358771 A1  Dec. 8, 2016

Related U.S. Application Data

(63) Continuation of application No. 14/850,419, filed on Sep. 10, 2015, now Pat. No. 9,449,840.

(30) Foreign Application Priority Data

Apr. 6, 2015 (KR) .................. 10-2015-0048672

(51) Int. Cl.
| H01L 21/027 | (2006.01) |
| H01L 21/311 | (2006.01) |
| H01L 21/033 | (2006.01) |
| H01L 21/02  | (2006.01) |

(52) U.S. Cl.
CPC .... *H01L 21/0276* (2013.01); *H01L 21/02118* (2013.01); *H01L 21/02318* (2013.01); *H01L 21/0338* (2013.01); *H01L 21/31144* (2013.01)

(58) Field of Classification Search
None
See application file for complete search history.

(56) References Cited

U.S. PATENT DOCUMENTS 9,449,840 B1 * 9/2016 Ban .................. H01L 21/31144

* cited by examiner

*Primary Examiner* — Asok K Sarkar
(74) *Attorney, Agent, or Firm* — IP & T Group LLP

(57) ABSTRACT

A method includes forming a template portion to provide a first opening trench portion surrounding a first isolated pattern, and forming an array of pillars on an underlying layer; forming a separation wall layer including first separation wall portions surrounding sidewalls of the pillars, and forming second separation wall portions covering sidewalls of the first opening trench portion; forming a block copolymer layer on the separation wall layer; forming first domains in gaps between the pillars, and forming second domains surrounding and separating the first domains by annealing the block copolymer layer; forming second openings by selectively removing the first domains; forming third openings between the second openings, and forming a fourth opening adjacent to the first isolated pattern by selectively removing the pillars and the template portion; and forming fifth openings, which extend from the second and third openings and penetrate the underlying layer, and forming a sixth opening, which extends from the fourth opening and penetrates the underlying layer.

18 Claims, 53 Drawing Sheets

METHODS OF FORMING DIFFERENT SIZED PATTERNS

CROSS-REFERENCE TO RELATED APPLICATION

This is a continuation application of Ser. No. 14/850,419, field on Sep. 10, 2015, entitled METHODS OF FORMING DIFFERENT SIZED PATTERNS, which claims priority of Korean patent application number 10-2015-0048672 filed on Apr. 6, 2015. The disclosure of each of the foregoing applications is incorporated herein by reference in its entirety.

BACKGROUND

1. Technical Field

Various embodiments of the present disclosure relate to semiconductor technologies and, more particularly, to methods of forming patterns having different critical dimensions (CDs).

2. Related Art

To increase integration density of semiconductor devices comprised of integrated circuits, it may be necessary to reduce an area occupied by a unit cell of the semiconductor devices and to increase the number of discrete devices such as transistors, resistors, capacitors or the like, integrated in a limited area of a semiconductor substrate. Various techniques have been attempted to realize fine pattern structures having a nano-scale critical dimension (CD), that is, a size ranging from a few nanometers to several tens of nanometers.

It is difficult to form nano-scale fine patterns of the semiconductor devices only with a photolithography process. Image resolution limits of lithography apparatuses for the photolithography process may be caused by the nature of optical systems for the photolithography process and wavelengths of lights generated from light sources of the optical systems. Methods of forming the fine patterns through a self-assembly of polymer molecules may be considered as a candidate for overcoming the image resolution limits. However, it is difficult to merely apply a direct self-assembly (DSA) of polymer molecules to methods of forming a plurality of patterns having different pitches for example, different widths or different spaces. Accordingly, it is necessary to further develop the methods of forming fine patterns using DSA of the polymer molecules to overcome the limitations of DSA technology.

SUMMARY

Various embodiments are directed to methods of forming different sized patterns.

According to an embodiment, there is provided a method of forming patterns. The method may include: forming a template portion to provide a first opening trench portion surrounding a first isolated pattern, and forming an array of pillars on an underlying layer; forming a separation wall layer including first separation wall portions surrounding sidewalls of the pillars, and forming second separation wall portions covering sidewalls of the first opening trench portion; forming a block copolymer layer on the separation wall layer; forming first domains in gaps between the pillars, and forming second domains surrounding and separating the first domains by annealing the block copolymer layer; forming second openings by selectively removing the first domains; forming third openings between the second openings, and forming a fourth opening adjacent to the first isolated pattern by selectively removing the pillars and the template portion; and forming fifth openings, which extend from the second and third openings and penetrate the underlying layer, and forming a sixth opening, which extends from the fourth opening and penetrates the underlying layer.

According to another embodiment, there is provided a method of forming patterns. The method may include: forming a template portion to provide a first opening trench portion surrounding a first isolated pattern, and forming an array of pillars on an underlying layer; forming a separation wall layer that covers the pillars, the first isolated pattern and the template portion; forming a block copolymer layer that fills gaps between the pillars and fills a gap between the first isolated pattern and the template portion; forming first domains in the gaps between the pillars, forming second domains surrounding and separating the first domains, forming a third domain in the first opening trench portion, and forming a fourth domain surrounding the third domain, by annealing the block copolymer layer, wherein the third domain is shallower than the first domains and a bottom portion of the fourth domain is thicker than bottom portions of the second domains; forming second openings by removing the first domains, and forming a seventh opening by removing the third domain; forming first extensions of the second openings, which penetrate the bottom portions of the second domains, and an extension of the seventh opening in the fourth domain without penetration of the bottom portion of the fourth domain, by etching the second and fourth domains; forming second extensions of the second openings, and exposing top surfaces of the pillars, a top surface of the first isolated pattern and a top surface of the template portion, by selectively removing portions of the separation wall layer exposed by the first extensions of the second openings; forming third openings by selectively removing the pillars, and forming a fourth opening by selectively removing the template portion; and forming fifth openings that penetrate the underlying layer and extend from the second and third openings, and forming a sixth opening that penetrates the underlying layer and extends from the fourth opening.

According to another embodiment, there is provided a method of forming patterns. The method may include: forming a template portion to provide a first opening trench portion surrounding a first isolated pattern, and forming an array of pillars on an underlying layer; forming a separation wall layer that covers the pillars, the first isolated pattern and the template portion; forming a block copolymer layer that fills gaps between the pillars and fills a gap between the first isolated pattern and the template portion; forming first domains in the gaps between the pillars, forming second domains surrounding and separating the first domains, forming a third domain in the first opening trench portion, and forming a fourth domain surrounding the third domain, by annealing the block copolymer layer, wherein the third domain is shallower than the first domains and a bottom portion of the fourth domain is thicker than bottom portions of the second domains; forming second openings by removing the first domains, and forming a seventh opening by removing the third domain; forming first extensions of the second openings which penetrate the bottom portions of the second domains, and an extension of the seventh opening in the fourth domain without penetration of the bottom portion of the fourth domain, by etching the second and fourth domains; forming second extensions of the second openings, and exposing top surfaces of the pillars, a top surface of the first isolated pattern and a top surface of the template portion, by selectively removing portions of the separation wall layer exposed by the first extensions of the second openings; forming a blocking pattern that covers the first isolated pattern and a portion of the template portion adjacent to the first isolated pattern; forming third openings by selectively removing the pillars using the blocking pattern as an etch mask, and forming a fourth opening by selectively removing the template portion; and forming fifth openings that penetrate the underlying layer and extend from the second and third openings, and forming a sixth opening that penetrates the underlying layer and extends from the fourth opening.

According to another embodiment, there is provided a method of forming patterns. The method may include: forming a template portion to provide a first opening trench portion surrounding a first isolated pattern, and forming an array of pillars on an underlying layer; forming a separation wall layer including separation wall portions that cover sidewalls of the pillars and sidewalls of the first openings; forming a block copolymer layer on the separation wall layer; forming first domains in gaps between the pillars, forming second domains surrounding and separating the first domains, forming third domains in the first openings, and forming fourth domains surrounding the third domains, by annealing the block copolymer layer; forming second openings in the gaps between the pillars, and forming third openings in the first openings, by selectively removing the first domains and the third domains; forming fourth openings by selectively removing the pillars; and forming fifth openings that penetrate the underlying layer and extend from the second and fourth openings, and forming sixth openings that penetrate the underlying layer and extend from the third openings.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
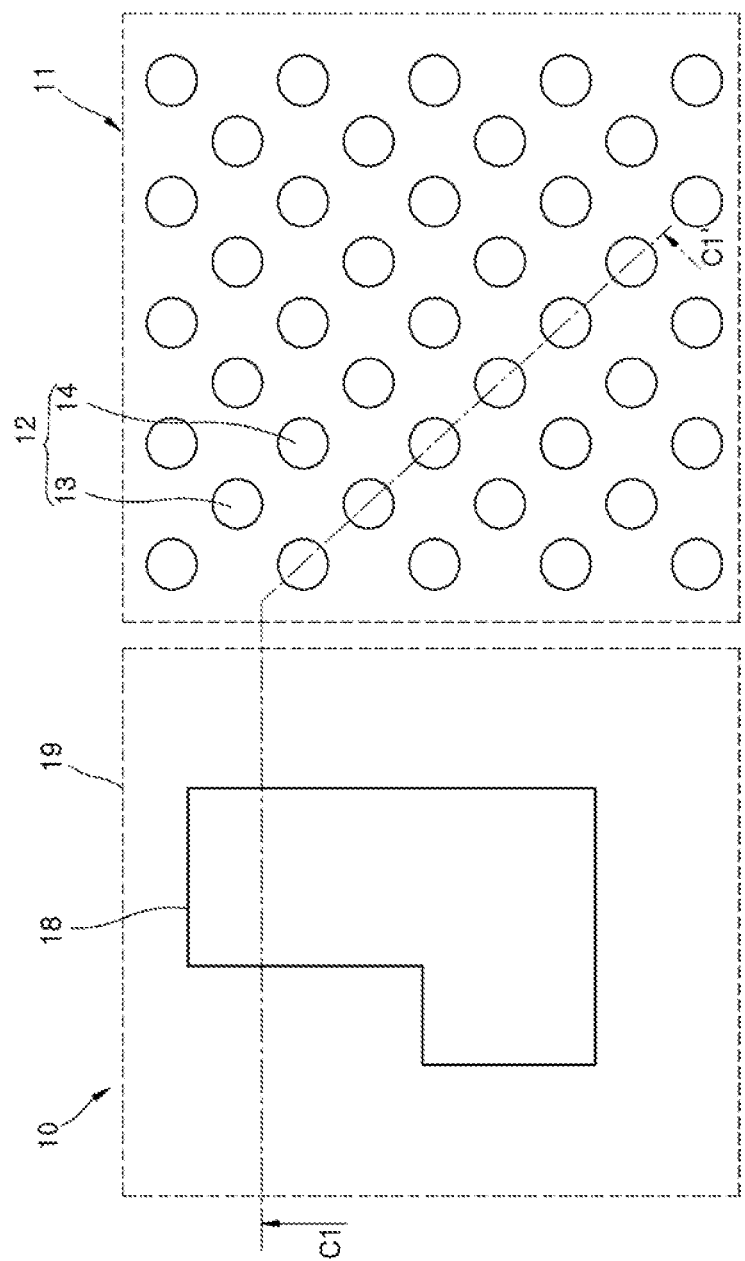
FIGS. 1 to 3 are plan views illustrating a process for obtaining a layout of a guide pattern used in a method of forming patterns according to an embodiment.

It will be understood that although the terms first, second, third etc. may be used herein to describe various elements, these elements should not be limited by these terms. These terms are only used to distinguish one element from another element. Thus, a first element in exemplary embodiments could be termed a second element in other embodiments without departing from the teachings of the present disclosure.

It will also be understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower,", "on", "over", "above," "upper", "side", "aside" and the like which are used herein are for the purpose of describing particular embodiments only and are not intended to limit the scope of the present disclosure. Other words used to describe the relationship between elements or layers should be interpreted in a like fashion for example, "between" versus "directly between" or "adjacent" versus "directly adjacent".

In the following embodiments, the term "dense patterns" may be used to describe patterns having a relatively small pitch size and a relatively short distance therebetween, and the term "isolated patterns" may be used to describe patterns having a relatively large pitch size and a relatively long distance therebetween. In addition, the term "regularly arrayed patterns" may be used to describe patterns arrayed to have a uniform pitch size and substantially the same distance therebetween, and the term "irregularly arrayed patterns" may be used to describe patterns arrayed to have non-uniform pitch sizes or different distances therebetween. The term "irregularly arrayed patterns" may also be used to describe patterns randomly arrayed without any regularity.

Exemplary embodiments of the present disclosure may provide methods of forming fine patterns through a phase separation of a block copolymer (BCP) layer so that the patterns have a line width less than a resolution limit of exposure apparatuses. For example, exemplary embodiments of the present disclosure may provide methods of forming an array of contact holes or an array of cutting holes for cutting line-shaped patterns through a direct self-assembly (DSA) technique of the BCP layer. Specific polymer blocks included in the BCP layer may be ordered and phase-separated from a matrix material to form domain portions under a specific condition, and the phase-separated domain portions may be selectively removed to form spaces or patterns having a nano-scaled feature size. The nano-scaled feature size may range from a few nanometers to several tens of nanometers.

A self-assembled structure of the BCP layer may have a cylindrical shape or a lamellar shape according to a volume ratio of two or more distinct polymer blocks included in the BCP layer, an annealing temperature for the phase separation of the BCP layer, a molecule size of the polymer blocks included in the BCP layer, and a molecular weight of the polymer blocks included in the BCP layer. That is, the phase-separated domain portions of the polymer blocks may have a cylindrical shape or a lamellar shape. When the self-assembled structure of the BCP layer has a cylindrical shape, the BCP layer may be used to form a hole array pattern. When the self-assembled structure of the BCP layer has a lamellar shape, the BCP layer may be used to form a line and space pattern.

Various embodiments of the present disclosure may be applied to fabrication of highly integrated semiconductor devices, for example, dynamic random access memory (DRAM) devices, phase changeable random access memory (PcRAM) devices or resistive random access memory (Re- RAM) devices. In addition, the following embodiments may be applied to fabrication of memory devices such as static random access memory (SRAM) devices, flash memory devices, magnetic random access memory (MRAM) devices or ferroelectric random access memory (FeRAM) devices. The following embodiments may also be applied to fabrication of logic devices, such as control devices, central processing units (CPU) or arithmetic logic units (ALU).

Figure 2:
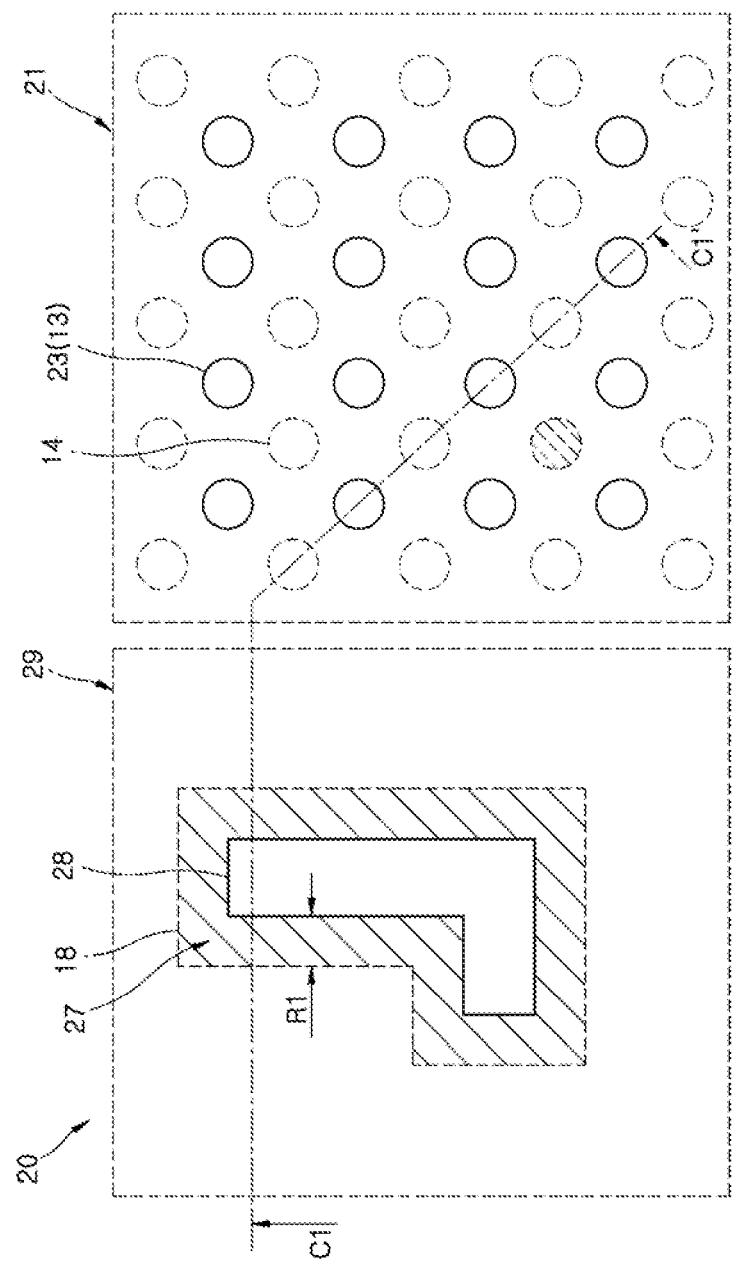
Figure 3:
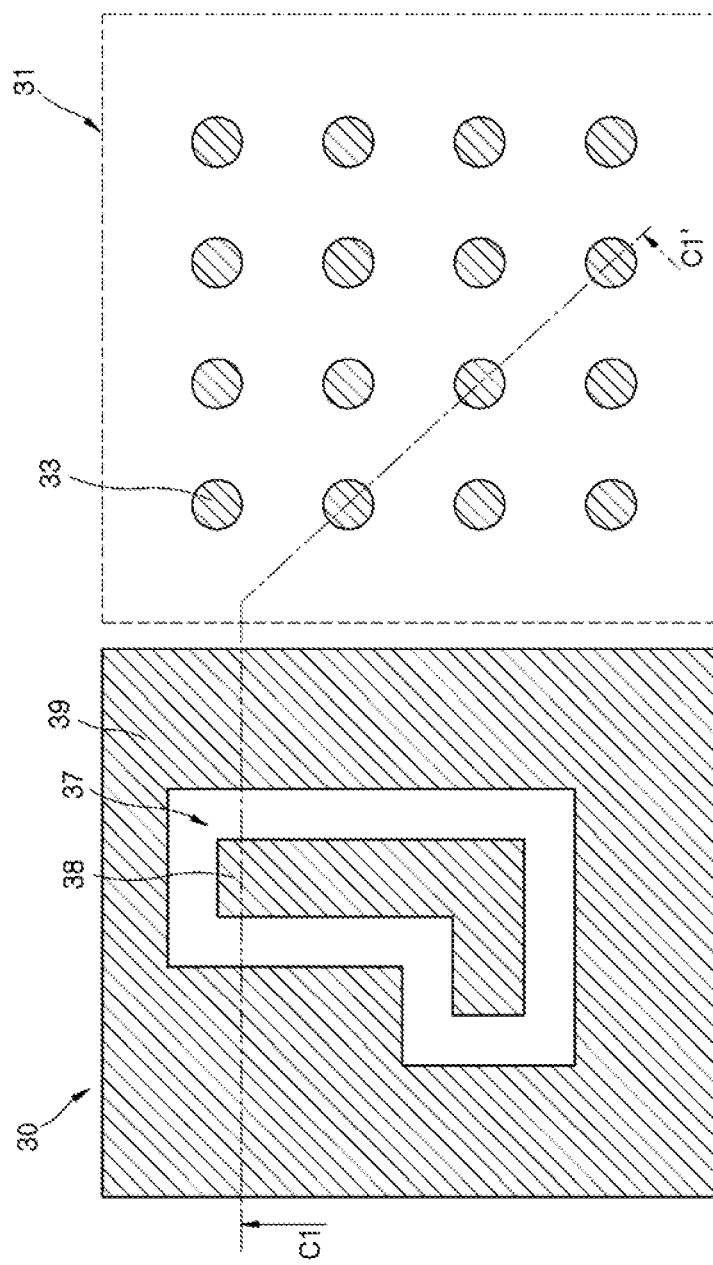

FIGS. 1 to 3 are plan views illustrating a process for obtaining a layout of a guide pattern used in a method of forming patterns according to an embodiment.

Referring to FIG. 1, a layout 10 of a target feature may include a layout 11 having an array of first target features 12 that are to be transferred onto a substrate to form fifth openings, and may include a layout 19 having a second target feature 18 that is to be transferred onto the substrate to form a second isolated pattern. The layout 11 of the first target features 12 and the layout 19 of the second target feature 18 may be located at different regions. For example, the layout 11 and the layout 19 may be adjacent to each other. The first target features 12 may be disposed in a dense pattern region such as a cell region, and the second target feature 18 may be disposed in an isolated pattern region such as a peripheral region. The second target feature 18 may have a line shape or a polygonal shape.

In the layout 11, the first target features 12 may include pillar features 13 for portions of guide patterns, and first domain features 14 between the pillar features 13. The first domain features 14 may be surrounded by four adjacent pillar features 13 during phase separation of the BCP material. Accordingly, the pillar features 13 may be separated from the first domain features 14 according to the phase separation of the BCP material.

Referring to FIGS. 1 and 2, a layout 20 may include a layout 21 having pillar features 23 and a layout 29 having a first isolated pattern 28 and a first opening trench portion 27. The layout 21 having the pillar features 23 may be obtained by separating the first domain features 14 from the layout 11 of the first target features 12. The layout of the first isolated pattern 28 may be obtained by resizing the second target feature 18 corresponding to the second isolated pattern. For example, the layout of the first isolated pattern 28 may be obtained by two-dimensionally shrinking the second target feature 18 by "R1" as shown in FIG. 2. In such a case, the layout of the first opening trench portion 27 may be obtained by removing the layout of the first isolated pattern 28 from the second target feature 18.

Referring to FIG. 3, a layout 30 of guide patterns may include pillar features 33 arrayed in a region 31, a template portion 39 exposing the region 31, and a first isolated pattern 38 disposed in the template portion 39 spaced apart from the template portion 39. The pillar features 33 may correspond to the pillar features 23 of FIG. 2, and the first isolated pattern 38 may correspond to the first isolated pattern 28 of FIG. 2. A region 37 between the template portion 39 and the first isolated pattern 38 may correspond to a first opening trench portion 27 of FIG. 2. That is, the first isolated pattern 38 may be surrounded by the first opening trench portion 37 in the template portion 39.

Figure 4:
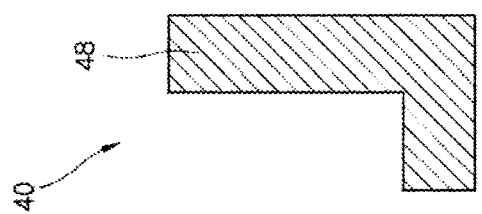
FIG. 4 is a plan view illustrating a layout of a blocking pattern used in a method of forming patterns according to an embodiment.

FIG. 4 is a plan view illustrating a layout 40 of a blocking pattern 48.

Referring to FIGS. 1 to 4, the layout 40 may include the blocking pattern 48 that is transferred onto the first isolated pattern 38 to form a mask pattern covering the first isolated pattern 38. The mask pattern formed by the blocking pattern 48 may remain to protect the first isolated pattern 38 while the template portion 39 is selectively removed. Thus, the first isolated pattern 38 may still remain due to the presence of the mask pattern formed by the blocking pattern 48 during removal of the template portion 39. The blocking pattern 48 may be obtained by two-dimensionally enlarging the first isolated pattern 38. For example, the blocking pattern 48 may have a layout of the second isolated pattern 18. In exemplary embodiments, the blocking pattern 48 may be formed by two-dimensionally enlarging the second isolated pattern 18 to overlap with a portion of the template portion 39 adjacent to the second isolated pattern 18.

FIGS. 5 to 18 are cross-sectional views taken along a line C1-C1' of FIGS. 1 to 3 to illustrate a method of forming patterns according to an embodiment.

Figure 5:
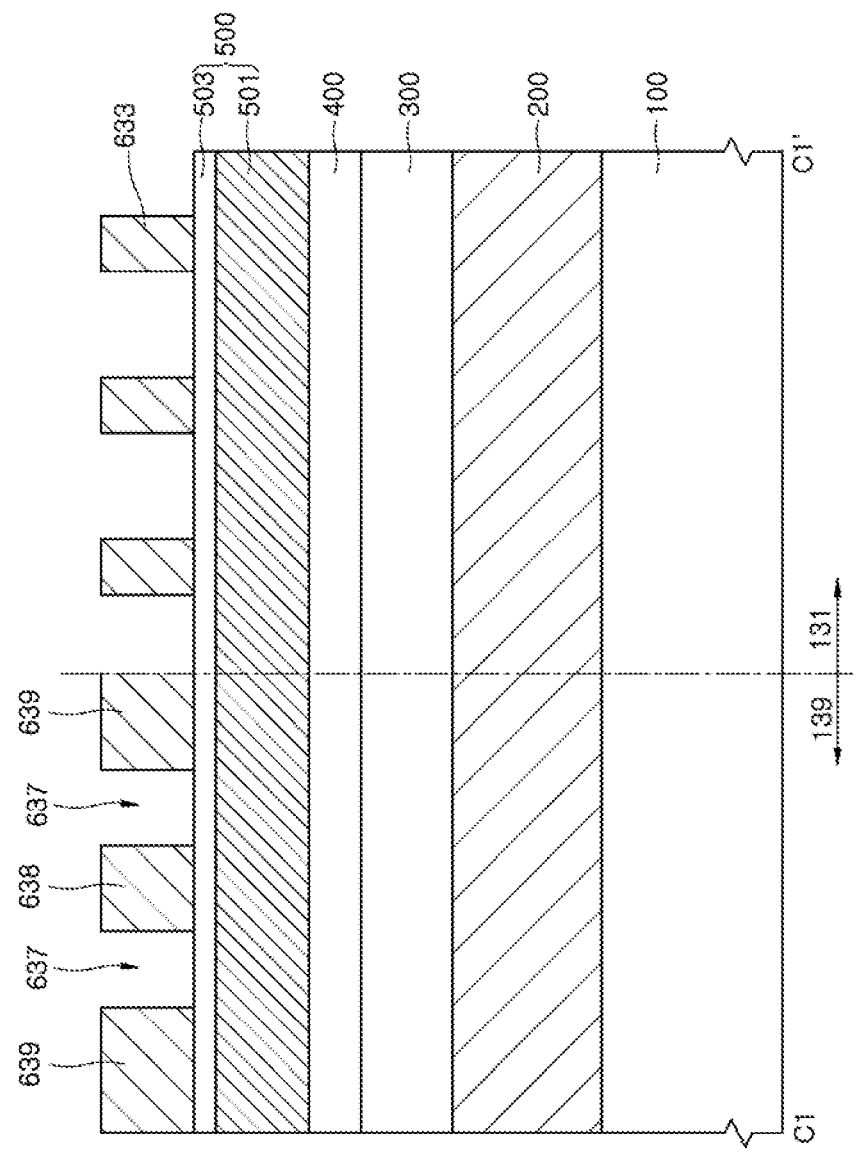
FIGS. 5 to 18 are cross-sectional views illustrating a method of forming patterns according to an embodiment.

FIG. 5 illustrates a step of forming mask patterns 633, 638 and 639 on a guide layer 500.

Referring to FIGS. 1 to 5, the mask patterns 633, 638 and 639 may be formed on the guide layer 500. The mask patterns 633, 638 and 639 may serve as etch masks when the guide layer 500 is etched in a subsequent process. The mask patterns 633, 638 and 639 may include first patterns 633 corresponding to the pillars 33, a second pattern 638 corresponding to the first isolated pattern 38, and a third pattern 639 corresponding to the template portion 39. Thus, a space region 637 between the second pattern 638 and the third pattern 639 may have substantially the same shape as the first opening trench portion 37. The mask patterns 633, 638 and 639 may include a photoresist material.

The guide layer 500 may be patterned in a subsequent process to form guide patterns, which are described with reference to FIGS. 1 to 3 and define positions of the domains in the phase-separated BCP layer. The guide layer 500 may be formed on a semiconductor substrate 100. The semiconductor substrate 100 may include a first region 131 on which the pillars 33 are disposed with high density, and may include a second region 139 on which the second isolated pattern 18 is disposed. The second region 139 may be distinct from and adjacent to the first region 131. The guide layer 500 may include a spin-on-carbon (SOC) layer 501 disposed on an underlying layer 400. The SOC layer 501 may have a thickness ranging from about 700 to about 800 angstroms. The guide layer 500 may further include a capping layer 503 disposed on the SOC layer 501. The capping layer 503 may be formed of a silicon oxynitride (SiON) layer having a thickness of about 300 angstroms.

The underlying layer 400 may be used to pattern a part of or an entire hard mask in a subsequent patterning process. For example, the underlying layer 400 may serve as one of multi-layers in a hard mask system. A second etch target layer 300 may be formed between the underlying layer 400 and the semiconductor substrate 100. In addition, a first etch target layer 200 may be formed between the second etch target layer 300 and the semiconductor substrate 100. The first or second etch target layer 200 or 300 may be one of the hard mask system, or may be selectively etched using the hard mask system as an etch mask in a subsequent process.

The first etch target layer 200 may be formed of an interlayer insulation layer including a silicon oxide layer such as a tetra-ethyl-ortho-silicate (TEOS) layer having a thickness of about 2200 angstroms. Alternatively, the first etch target layer 200 may be formed of a conductive layer such as a doped polysilicon layer. The second etch target layer 300 may be formed by depositing an amorphous SOC layer having a thickness ranging from about 730 to about 1000 angstroms on the first etch target layer 200. The underlying layer 400 may be formed on the second etch target layer 300 and may include a silicon oxynitride (SiON) layer having a thickness ranging from about 300 to about 350 angstroms.

Figure 6:
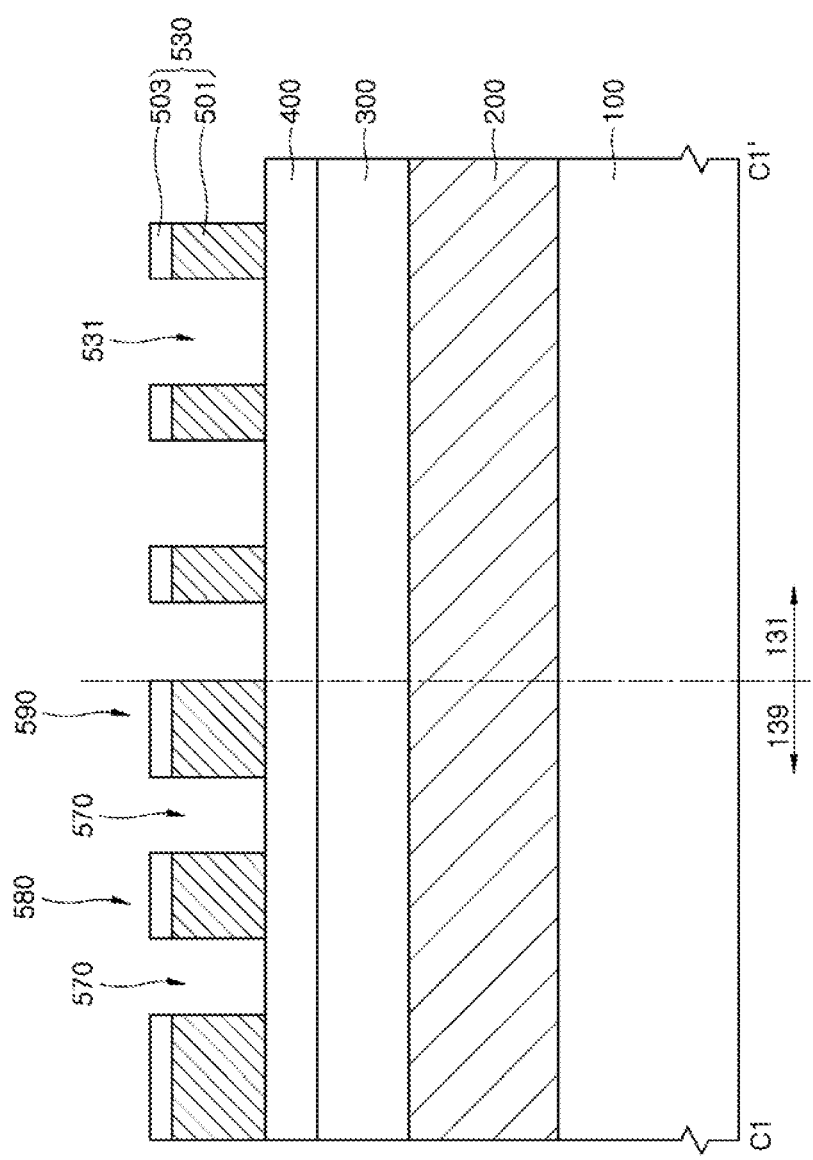

FIG. 6 illustrates a step of forming an array of pillars 530, a first isolated pattern 580 and a template portion 590.

Referring to FIG. 6, the guide layer 500 may be etched using the mask patterns 633, 638 and 639 as etch masks, thereby forming the array of the pillars 530, the first isolated pattern 580 and the template portion 590. The array of the pillars 530 may be formed on the first region 131 of the semiconductor substrate 100, and the first isolated pattern 580 and the template portion 590 may be formed on the second region 139 of the semiconductor substrate 100. A space region between the first isolated pattern 580 and the template portion 590 may correspond to a first opening trench portion 570.

The pillars 530 may be arrayed so that four adjacent pillars 530 are positioned to form a rectangular shape. Alternatively, the pillars 530 may be arrayed so that three adjacent pillars 530 are positioned to form a triangular shape. The pillars 530 may be arrayed to have a gap 531 between two adjacent pillars 530 which are disposed on the line C1-C1'. As illustrated in FIG. 3, a gap between two adjacent pillars 33 which are arrayed on a horizontal line may be narrower than the gap between two adjacent pillars 33 which are arrayed on the diagonal portion of the line C1-C1'. The pillars 530 may serve as guide patterns that induce self-assembly of the BCP layer which is formed in a subsequent process. The first isolated pattern 580 and the template portion 590 may serve as guide patterns that prevent the self-assembly of the BCP layer on the second region 139.

Figure 7:
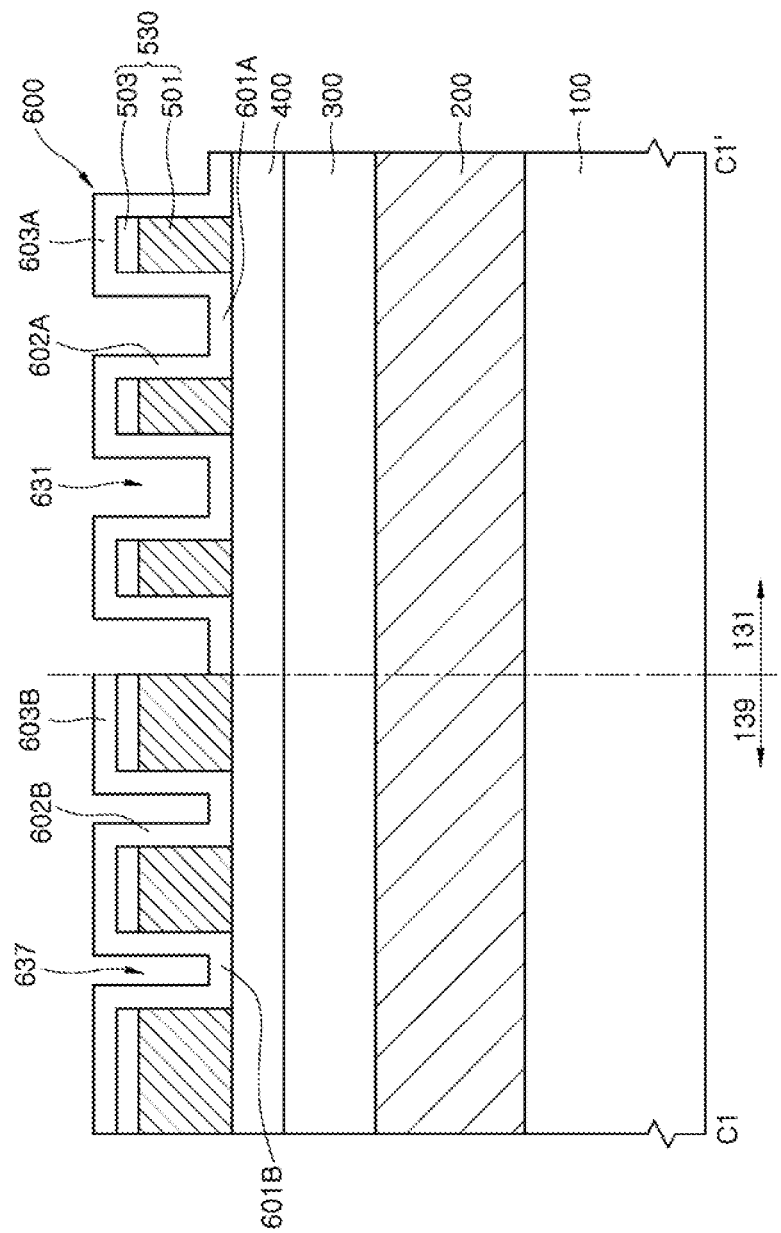

FIG. 7 illustrates a step of forming a separation wall layer 600.

Referring to FIGS. 6 and 7, the separation wall layer 600 may include first separation wall portions 602A covering sidewalls of the pillars 530, and second separation wall portions 602B covering sidewalls of the first opening trench portion 570. The separation wall layer 600 may include first extensions 601A extending from the first separation wall portions 602A to cover portions of the underlying layer 400 exposed by the gaps 531, and second extensions 603A extending from the first separation wall portions 602A to cover top surfaces of the pillars 530. The separation wall layer 600 may further include third extensions 601B extending from the second separation wall portions 602B to cover portions of the underlying layer 400 exposed by the first opening trench portion 570, and fourth extensions 603B extending from the second separation wall portions 602B to cover top surfaces of the first isolated pattern 580 and the template portion 590.

The separation wall layer 600 may provide recessed regions defined by gaps 631 between the pillars 530, and a recessed region defined by a gap 637 between the first isolated pattern 580 and the template portion 590. The separation wall layer 600 may be formed of an insulation layer having an etch selectivity with respect to the pillars 530 and the underlying layer 400. For example, the separation wall layer 600 may be formed of an ultra-low temperature oxide (ULTO) layer having a thickness of about 200 angstroms.

Figure 8:
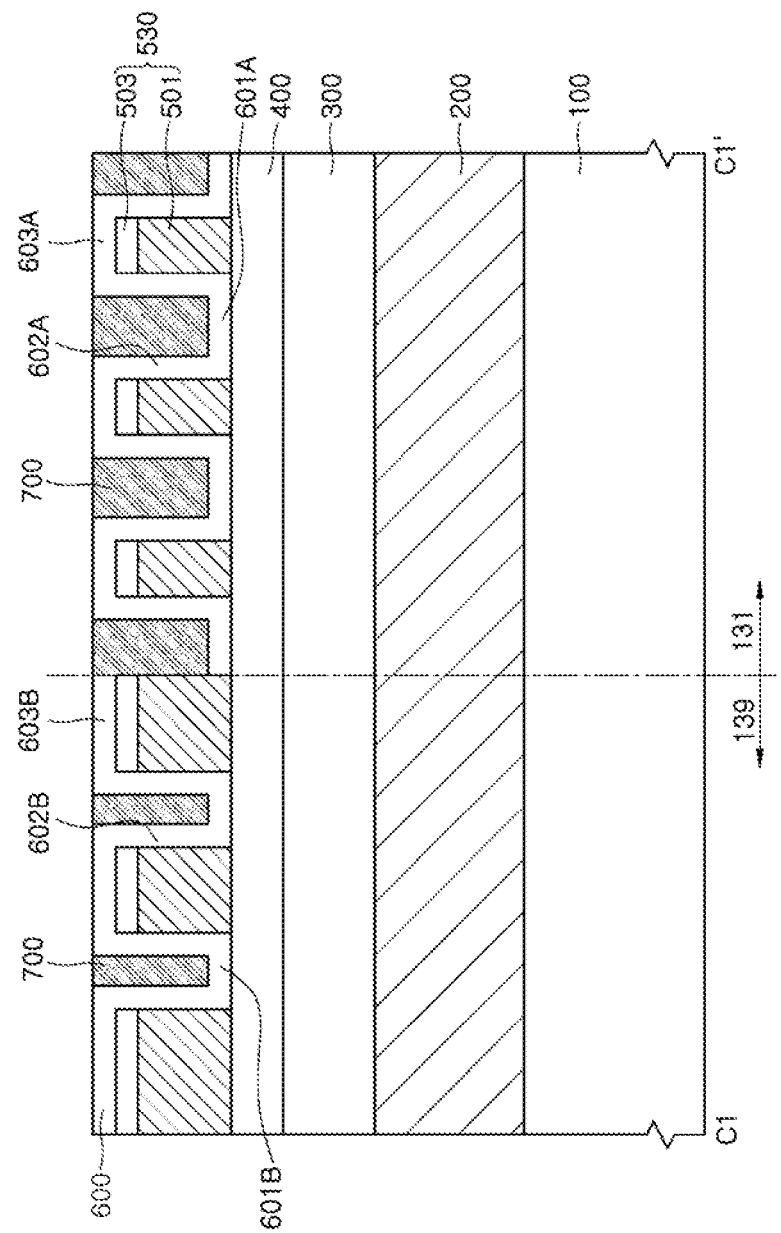

FIG. 8 illustrates a step of forming the BCP layer 700.

Referring to FIG. 8, the BCP layer 700 may be formed on the separation wall layer 600 to fill the gaps 631 and 637 which are provided by the pillars 530, the first isolated pattern 580 and the template portion 590. The BCP layer 700 may include a polystyrene-poly (meta methyl acrylate) block copolymer (PS-b-PMMA) material or a polystyrene-poly (di methyl siloxane) (PS-PDMS) block copolymer material. When the BCP layer 700 is formed of the PS-b-PMMA material including PS blocks and PMMA blocks, a volume ratio of the PS blocks to the PMMA blocks may be controlled to be within the range from about 7:3 to about 5:5. The volume ratio of the PS blocks to the PMMA blocks or molecular weights of the PS block and the PMMA block may be appropriately controlled according to a process scheme. For example, the PS-b-PMMA material may have a PS block content of about 60 vol. % to about 80 vol. % and a PMMA block content of about 20 vol. % to about 40 vol. %.

Figure 51:
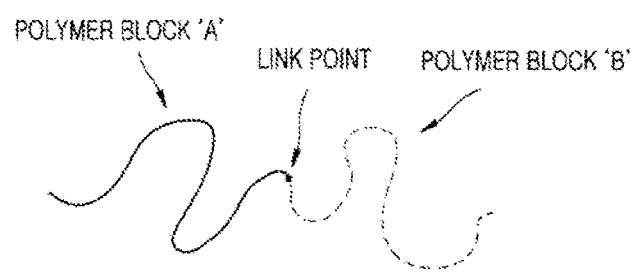
FIGS. 51 to 53 are schematic views illustrating phase separations of block copolymer (BCP) layers used in exemplary embodiments.
Figure 52:
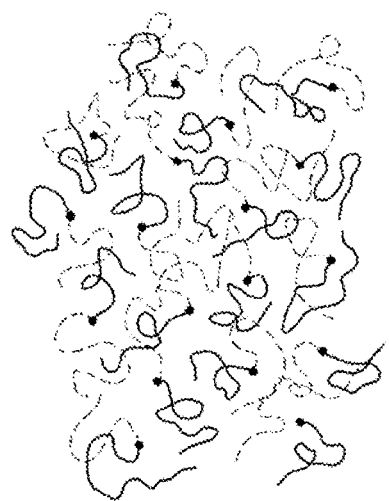
Figure 53:
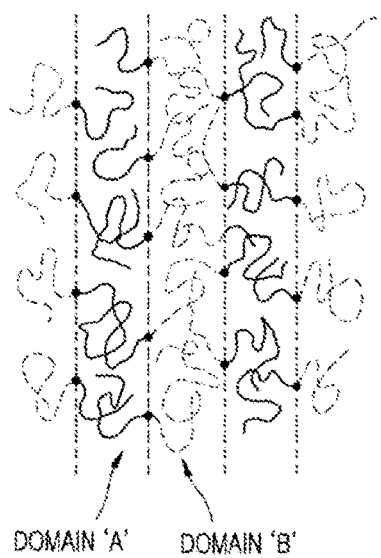

FIGS. 51 to 53 are schematic views illustrating the phase separation of the BCP layer 700 for exemplary embodiments. The BCP layer 700 may be a functional polymer material made by combining polymer blocks having two or more distinct structures into a single block copolymer material through a covalent bond, as illustrated in FIG. 51. As illustrated in FIG. 51, the BCP layer 700 may have a chain shape including polymer blocks 'A' and 'B', which are connected to each other by a covalent bond through a link point. Referring to FIG. 52, the BCP layer 700 may be coated to have a homogeneous phase. Referring to FIG. 53, the polymer blocks having distinct structures in the BCP layer 700 may have different miscibility and different solubility from each other due to different chemical structures thereof. That is, the polymer blocks having distinct structures are immiscible with each other at a certain temperature. Thus, the BCP layer 700 may be phase-separated through an annealing process to provide a self-aligned structure. Accordingly, the BCP layer 700 having a homogeneous phase may be phase-separated into a domain 'A' in which polymer blocks 'A' are ordered and a domain 'B' in which polymer blocks 'B' are ordered, through an annealing process. As such, polymer blocks of the BCP layer 700 may be phase-separated or selectively dissolved in a liquid state or in a solid state to form a self-assembled structure.

A nano-scale structure having a specific shape through the self-assembly of the BCP layer 700 may be affected by a physical property and/or a chemical property of the polymer blocks of the BCP layer 700. When a BCP layer including two distinct polymer blocks is self-assembled on the substrate, the self-assembled structure of the BCP layer may have a three dimensional cubic shape, a three dimensional double helix shape, a two dimensional hexagonal packed column shape, a two dimensional lamella shape and so forth according to a volume ratio of the polymer blocks included in the BCP layer, an annealing temperature for phase separation of the BCP layer, and a molecule size of the polymer blocks included in the BCP layer.

In exemplary embodiments, the BCP layer 700 may be formed of polybutadiene-polybutylmethacrylate block copolymer, polybutadiene-polydimethylsiloxane block copolymer, polybutadiene-polymethylmethacrylate block copolymer, polybutadienepolyvinylpyridine block copolymer, polybutylacrylate-polymethylmethacrylate block copolymer, polybutylacrylate-polyvinylpyridine block copolymer, polyisoprene-polyvinylpyridine block copolymer, polyisoprene-polymethylmethacrylate block copolymer, polyhexylacrylatepolyvinylpyridine block copolymer, polyIsobutylene-polybutylmethacrylate block copolymer, polyisobutylene-polymethylmethacrylate block copolymer, polyisobutylene-polybutylmethacrylate block copolymer, polyIsobutylenepolydimethylsiloxane block copolymer, polybutylmethacrylatepolybutylacrylate block copolymer, polyethylethylene-polymethylmethacrylate block copolymer, polystyrene-polybutylmethacrylate block copolymer, polystyrene-polybutadiene block copolymer, polystyrene-polyisoprene block copolymer, polystyrene-polydimethylsiloxane block copolymer, polystyrene-polyvinylpyridine block copolymer, polyethylethylene-polyvinylpyridine block copolymer, polyethylene-polyvinylpyridine block copolymer, polyvinylpyridinepolymethylmethacrylate block copolymer, polyethyleneoxide-polyisoprene block copolymer, polyethyleneoxide-polybutadlene block copolymer, polyethyleneoxide-polystyrene block copolymer, polyethyleneoxidepolymethylmethacrylate block copolymer, polyethyleneoxide-polydimethylsiloxane block copolymer, polystyrene-polyethyleneoxide block copolymer and so forth.

Figure 9:
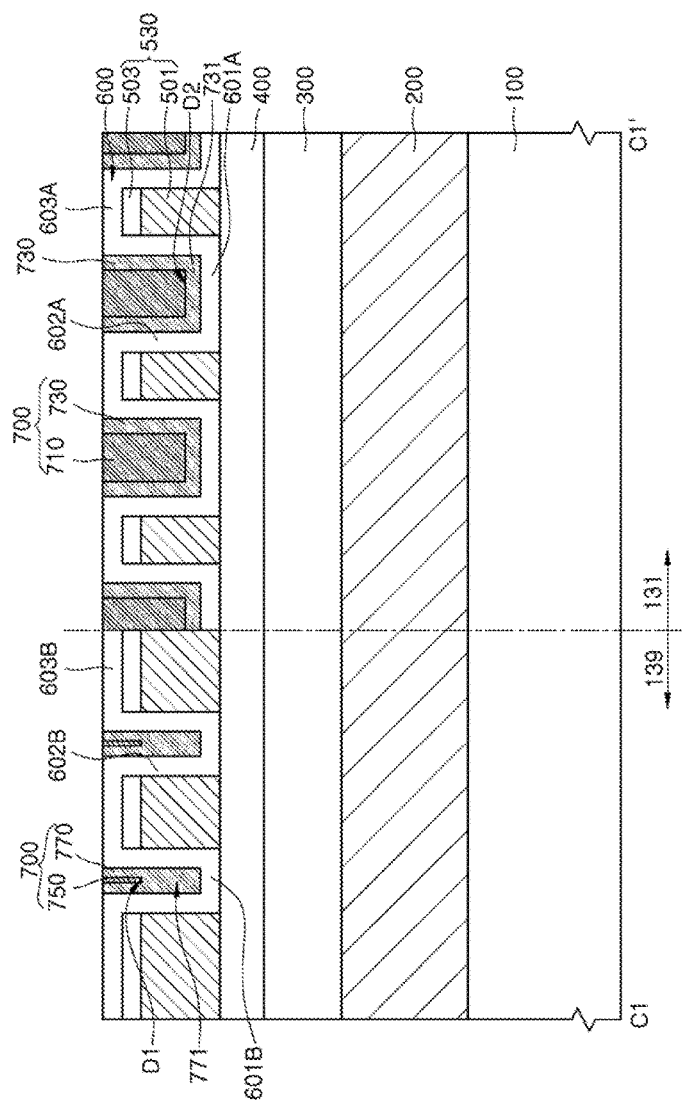

FIG. 9 illustrates a step of phase-separating the BCP layer 700.

Referring to FIGS. 6 to 9, the BCP layer 700 may be phase-separated through an annealing process into first domains 710 respectively located at central portions of the gaps 631 between the pillars 530 arrayed on the line C1-C1', and a second domain 730 disposed between the pillars 530 to surround the first domains 710 and to isolate the first domains 710 from each other. The first domains 710 may fill recessed regions provided by the second domain 730. Thus, the first domains 710 may have post shapes and may be surrounded by the second domain 730.

While the BCP layer 700 is phase-separated through an annealing process, a portion of the BCP layer 700 filling the gap 637 provided by the separation wall layer 600 on the second region 139 may be phase-separated into a third domain 750 and a fourth domain 770 surrounding the third domain 750 in the gap 637. In such a case, the third domain 750 may insufficiently expand toward a bottom surface of the gap 637 to have a smaller depth than the first domains 710. This is due to the gap 637 having a smaller width than the gaps 631. Since the third domain 750 does not sufficiently expand toward the bottom surface of the gap 637, a bottom surface D1 of the third domain 750 may be located adjacent to an entrance of the gap 637. That is, the bottom surface D1 of the third domain 750 may be located at a higher level than bottom surfaces D2 of the first domains 710. Accordingly, a bottom portion 771 of the fourth domain 770 surrounding the bottom surface D1 and sidewalls of the third domain 750 may be thicker than bottom portions 731 of the second domain 730. In exemplary embodiments, the gap 637 may have an Insufficient space to accommodate two different domains 750 and 770. In such a case, a portion of the BCP layer 700 filling the gap 637 may not be phase-separated even though the BCP layer 700 is annealed.

The phase separation of the BCP layer 700 may be achieved by annealing the BCP layer 700 at a temperature exceeding a glass transition temperature Tg of the BCP layer 700 to rearrange the polymer blocks of the BCP layer 700. For example, to rearrange the polymer blocks of the BCP layer 700, the BCP layer 700 may be annealed at a temperature ranging from about 100 to about 190 degrees Celsius for a time ranging from about six minutes to about twenty four hours.

Figure 10:
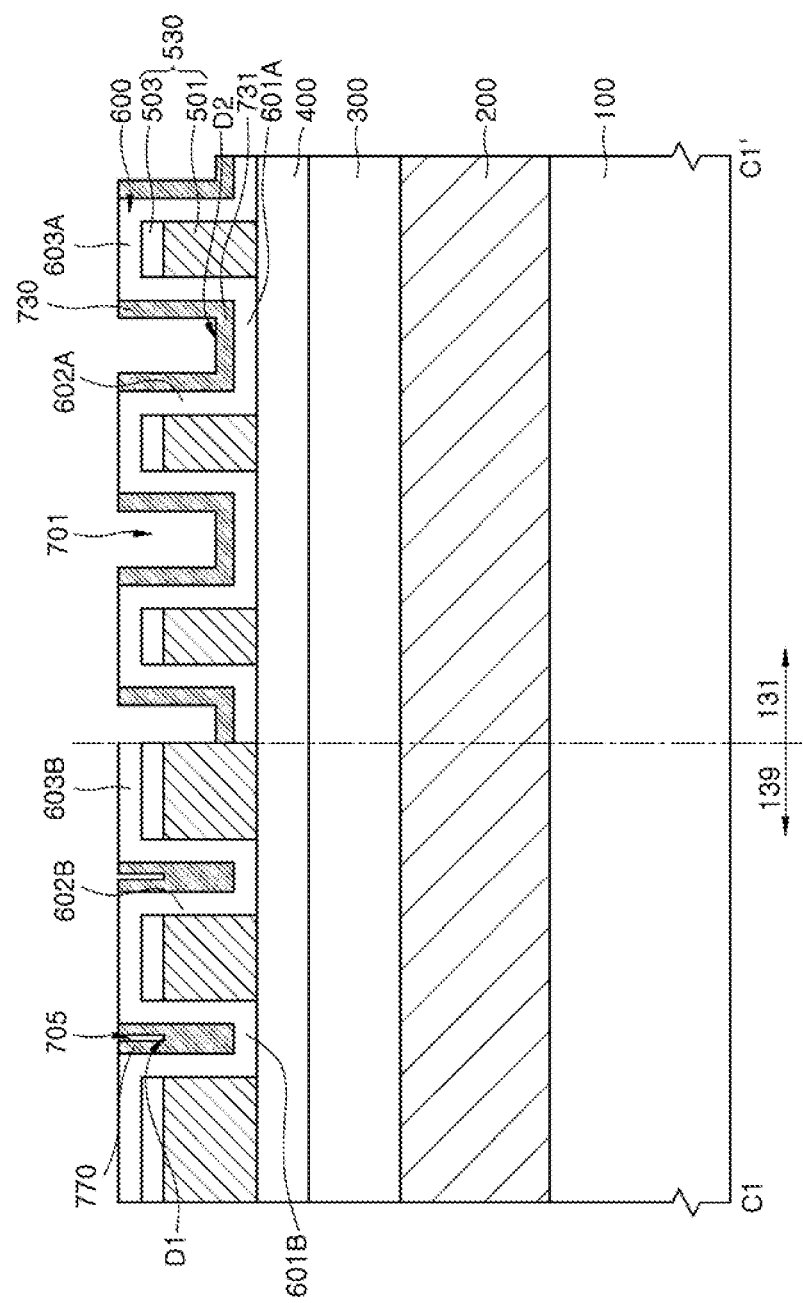

FIG. 10 illustrates a step of forming a plurality of second openings 701 and a seventh opening 705.

Referring to FIGS. 6 to 10, the first domains 710 may be selectively removed to form the plurality of second openings 701 located between the pillars 530. While the first domains 710 are selectively removed, the third domain 750 may also be removed to form the seventh opening 705 in the first opening trench portion 570. In such a case, the seventh opening 705 may be shallower than the second openings 701.

Figure 11:
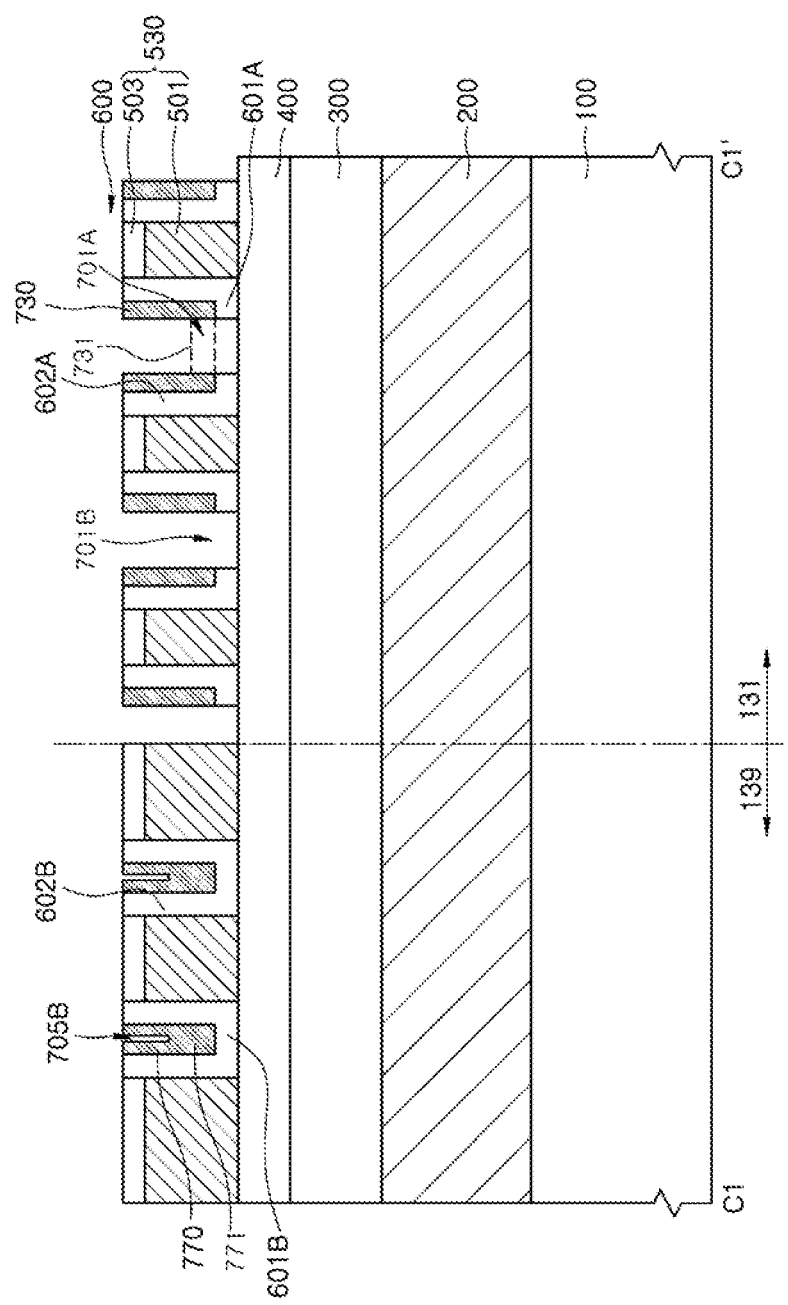

FIG. 11 illustrates a step of forming second extensions 701B of the second openings 701.

Referring to FIGS. 6 to 11, the bottom portions 731 of the second domain 730 exposed by the second openings 701 may be selectively removed to form first extensions 701A of the second openings 701 extending from the second openings 701. While the bottom portions 731 of the second domain 730 are selectively removed, the bottom portion 771 of the fourth domain 770 exposed by the seventh opening 705 may be partially removed to form an extension 705B of the seventh opening 705. However, the extension 705B of the seventh opening 705 may be formed not to penetrate the bottom portion 771 of the fourth domain 770. As a result, a feature of the seventh opening 705 may not be transferred into the bottom portion 771 of the fourth domain 770.

Subsequently, the first extensions 601A of the separation wall layer 600 exposed by the first extensions 701A of the second openings 701 may be selectively removed to form the second extensions 701B of the second openings 701 extending from the second openings 701. While the first extensions 601A of the separation wall layer 600 are selectively removed, the second extensions 603A of the separation wall layer 600 covering the top surfaces of the pillars 530 and the template portion 590 may also be removed to expose the top surfaces of the pillars 530 and the template portion 590.

Figure 12:
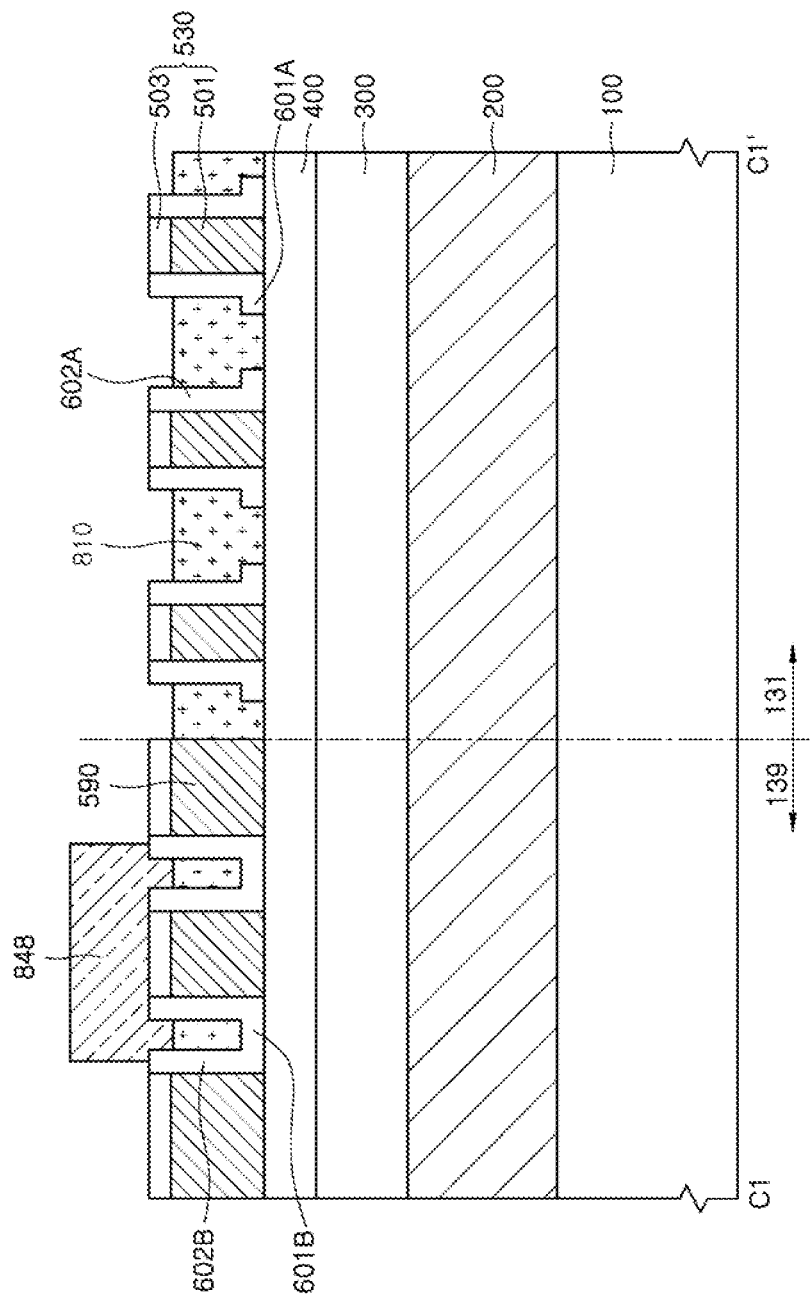

FIG. 12 illustrates a step of forming a blocking pattern 848.

Referring to FIGS. 4 to 12, the blocking pattern 848 may cover the first isolated pattern 580. Before the blocking pattern 848 is formed, residues of the BCP layer 700 including the second domain 730 and the fourth domain 770 may be removed. After the residues of the BCP layer 700 are removed, a sacrificial layer 810 may be formed on the pillars 530, the first isolated pattern 580 and the template portion 590 to fill the second extensions 701B of the second openings 701, the gaps between the pillars 530, and the gap between the first isolated pattern 580 and the template portion 590. The blocking pattern 848 may extend to cover the second separation wall portions 602B adjacent to the first isolated pattern 580. The blocking pattern 848 may be formed by transferring a layout feature of the blocking pattern 848. The blocking pattern 848 may cover all of the first isolated pattern 580, the second separation wall portions 602B and the third extensions 601B. However, in exemplary embodiments, the blocking pattern 848 may be laterally shifted from an expected position due to an overlay shift during an alignment and exposure process. Even though the blocking pattern 848 is laterally shifted, the first isolated pattern 580 may still be sealed with the second separation wall portions 602B and the blocking pattern 848 as far as the first isolated pattern 580 is laterally shifted within an allowable overlay range since the second separation wall portions 602B and the blocking pattern 848 are disposed around the first isolated pattern 580.

Figure 13:
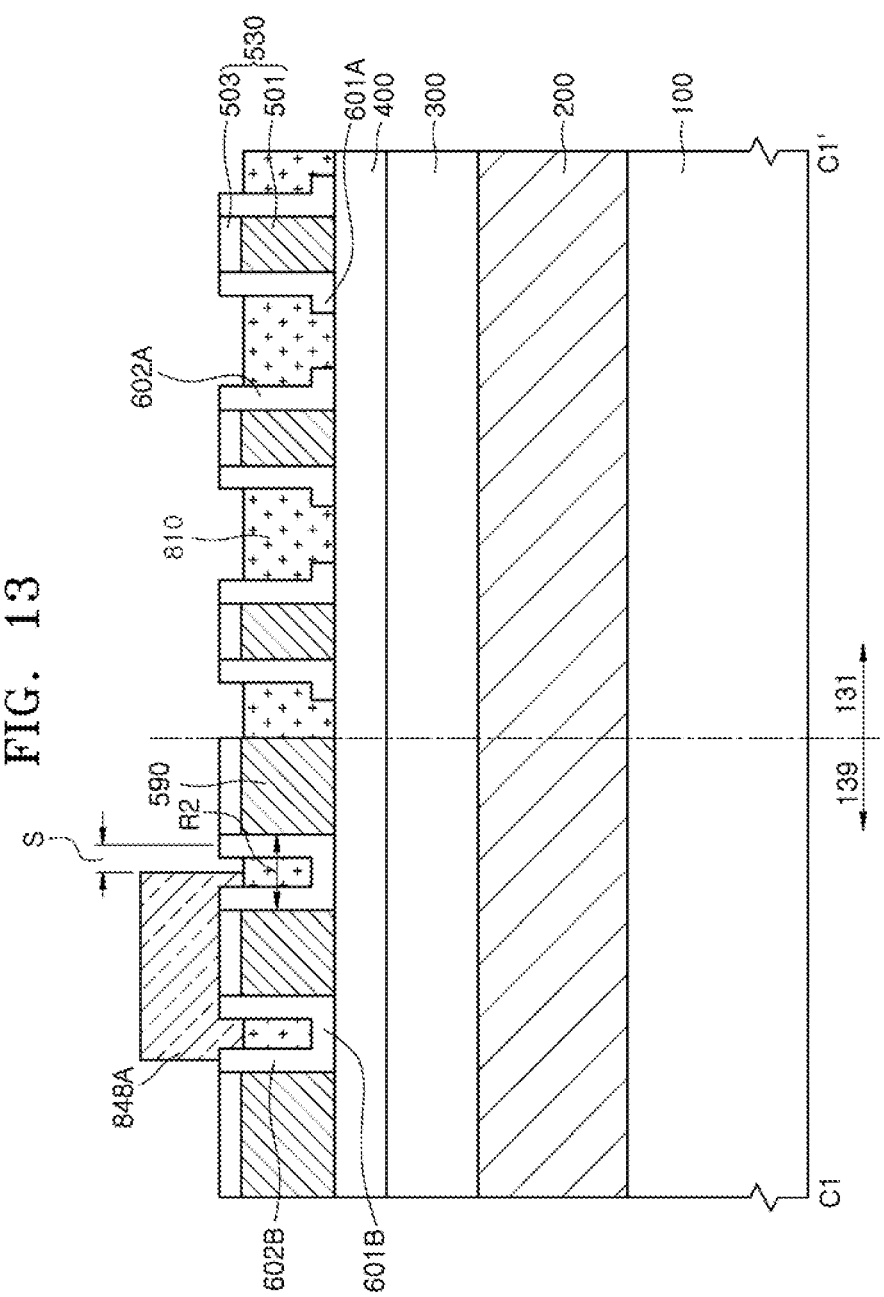

FIG. 13 is a cross-sectional view illustrating a blocking pattern 848A which is laterally shifted.

Referring to FIGS. 6 to 13, in the event that the blocking pattern 848A is laterally shifted by "S", the blocking pattern 848A may cover a portion of the template portion 590. Nevertheless, the blocking pattern 848A may have an alignment margin of about "R2" corresponding to a width of the first opening trench portion 570. That is, even though the blocking pattern 848A is shifted so that an edge of the blocking pattern 848A is disposed in the first opening trench portion 570, the first isolated pattern 580 may still be sealed with the second separation wall portions 602B and the third extensions 601B.

Figure 14:
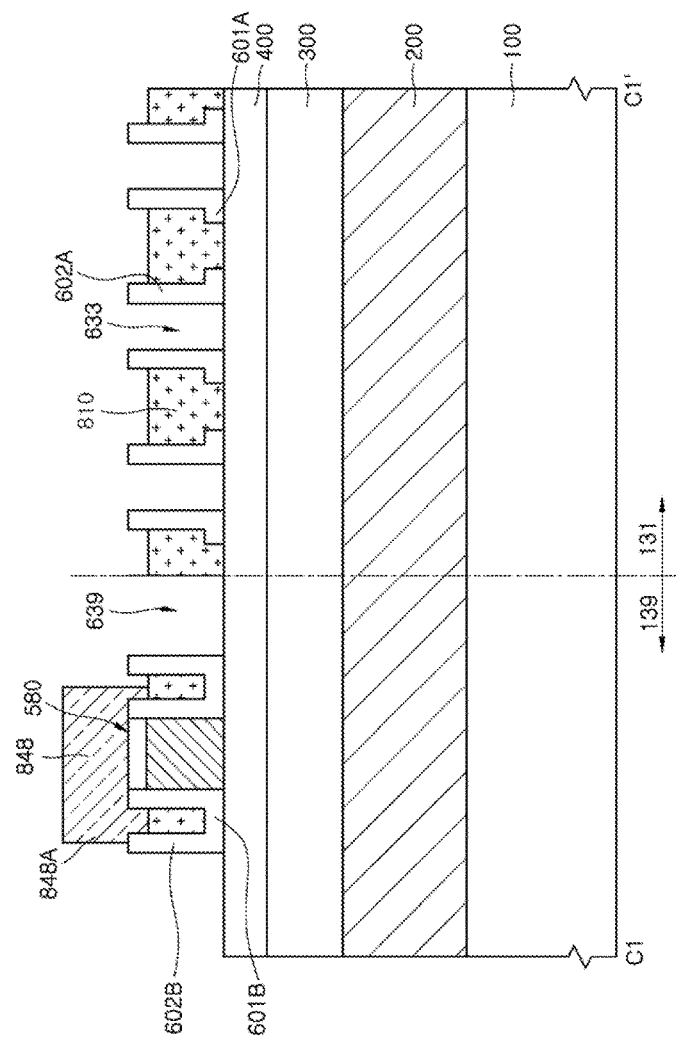

FIG. 14 illustrates a step of selectively removing the pillars 530 and the template portion 590.

Referring to FIGS. 6 to 14, the pillars 530 and the template portion 590 may be selectively etched and removed using the planarized sacrificial layer 810, the first and second separation wall portions 602A and 602B, the first and third extensions 601A and 601B, and the blocking pattern 848 as etch masks. The pillars 530 may be removed to form third openings 633, and the template portion 590 may be removed to form a fourth opening 639.

Figure 15:
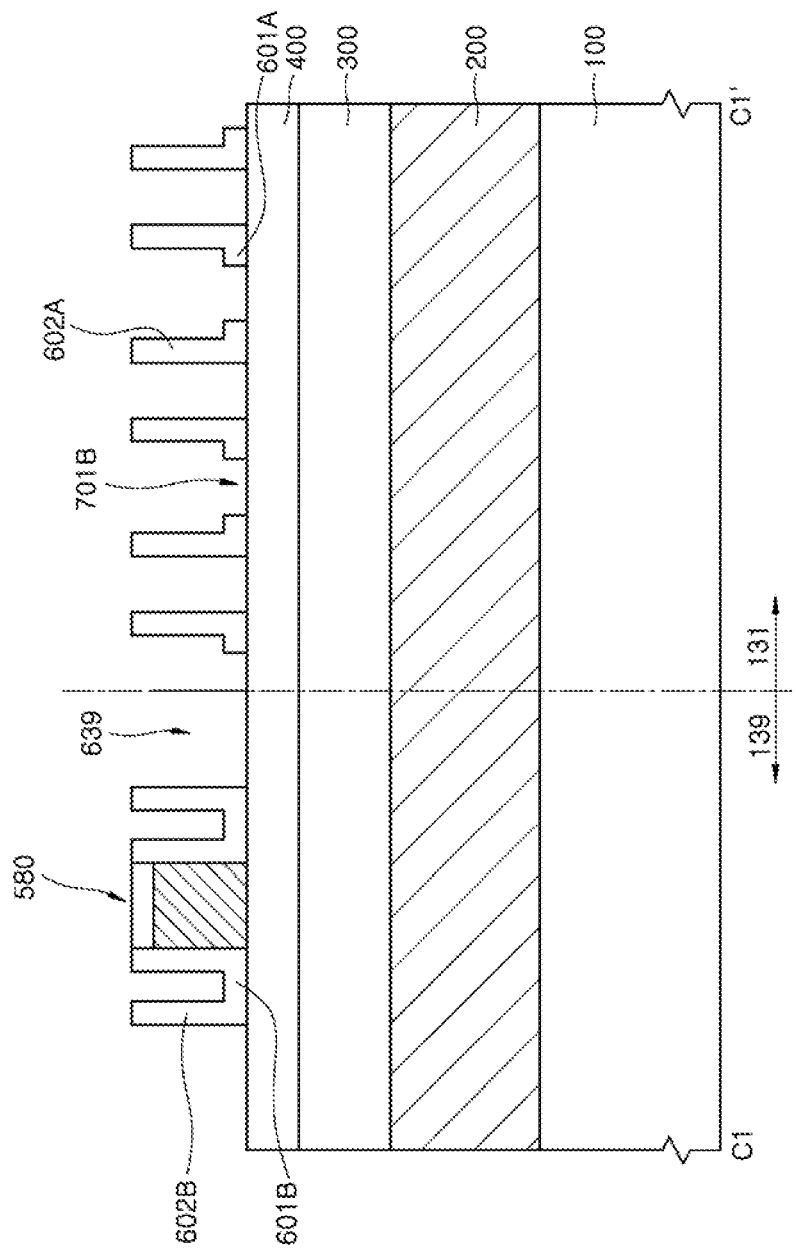

FIG. 15 illustrates a step of removing the blocking pattern 848.

Referring to FIGS. 14 and 15, the blocking pattern 848 and the planarized sacrificial layer 810 may be selectively removed to expose the second extensions 701B of the second openings 701 extending from the second openings 701.

Figure 16:
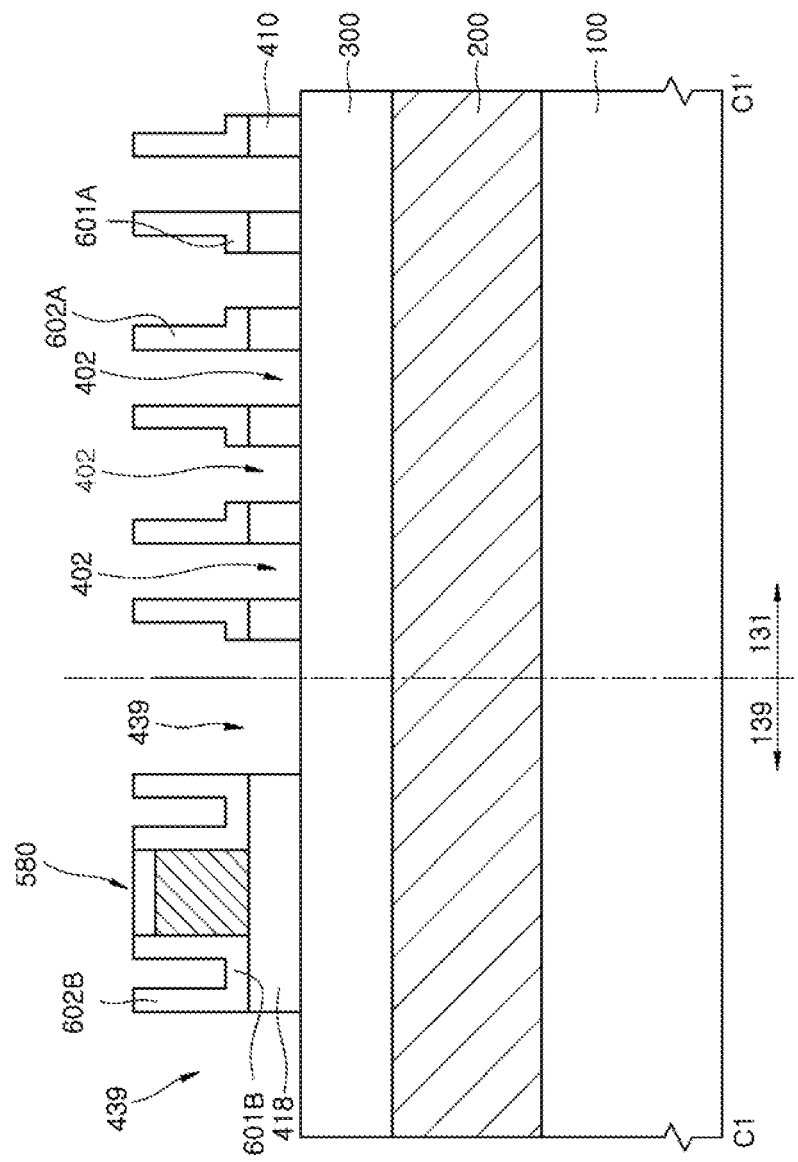

FIG. 16 illustrates a step of forming fifth openings 402 and a sixth opening 439.

Referring to FIGS. 6 to 16, the underlying layer 400 on the first region 131 may be etched using the first separation wall portions 602A and the first extensions 601A as etch masks, thereby forming the fifth openings 402 that extend from the second extensions 701B of the second openings 701 and extend from the third openings 633. While the fifth openings 402 are formed, the underlying layer 400 may be patterned to include a first pattern 410 that provides the fifth openings 402. In addition, the underlying layer 400 on the second region 139 may be etched using the first isolated pattern 580, and the second separation wall portion 602B and the third extension 601B as etch masks, thereby forming the sixth opening 439 that extends from the fourth opening 639. Accordingly, the underlying layer 400 may be patterned to include a second pattern 418 that provides the sixth opening 439. The second pattern 418 may correspond to the second isolated pattern. The fifth openings 402 and the sixth opening 439 may be simultaneously formed.

Figure 17:
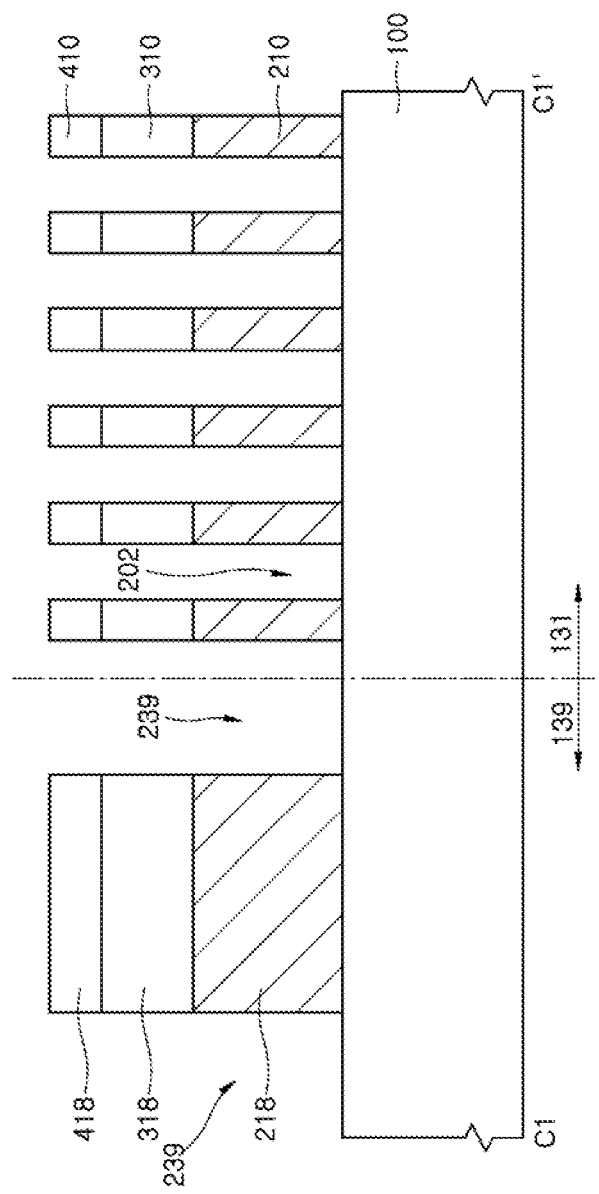
Figure 18:
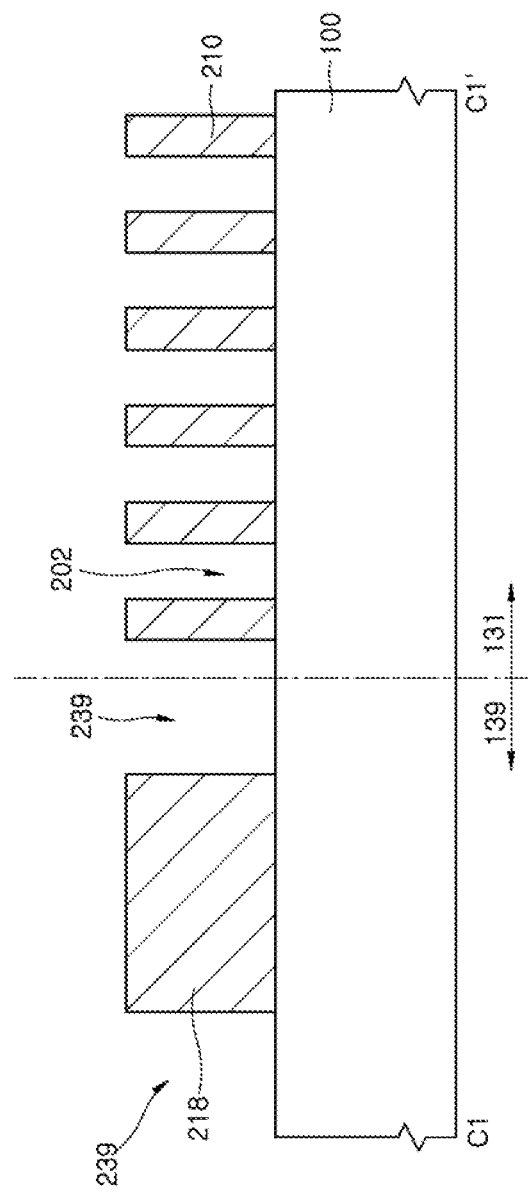

FIGS. 17 and 18 illustrate a step of forming extensions 202 of the fifth openings 402 and an extension 239 of the sixth opening 439.

Referring to FIGS. 17 and 18, the second etch target layer 300 and the first etch target layer 200 may be etched using the first pattern 410 and the second isolated pattern 418 as etch masks, thereby forming the extensions 202 of the fifth openings 402 and the extension 239 of the sixth opening 439 that penetrate the first and second etch target layers 200 and 300. As a result, a second pattern 318 of the second etch target layer 300 and a second pattern 218 of the first etch target layer 200 may be provided by the extension 239 of the sixth opening 439 on the second region 139, and a first pattern 310 of the second etch target layer 300 and a first pattern 210 of the first etch target layer 200 may be provided by the extensions 202 of the fifth opening 402 on the first region 131. Subsequently, the first pattern 410 of the underlying layer 400, the second isolated pattern 418, and the first and second patterns 310 and 318 of the second etch target layer 300 may be removed to leave the second pattern 218 having a planar shape of the second isolated pattern 418 and the first pattern 210 providing the extensions 202 of the fifth opening 402.

FIGS. 19 to 22 are plan views illustrating a process for obtaining a layout of a guide pattern used in a method of forming patterns according to another embodiment.

Figure 19:
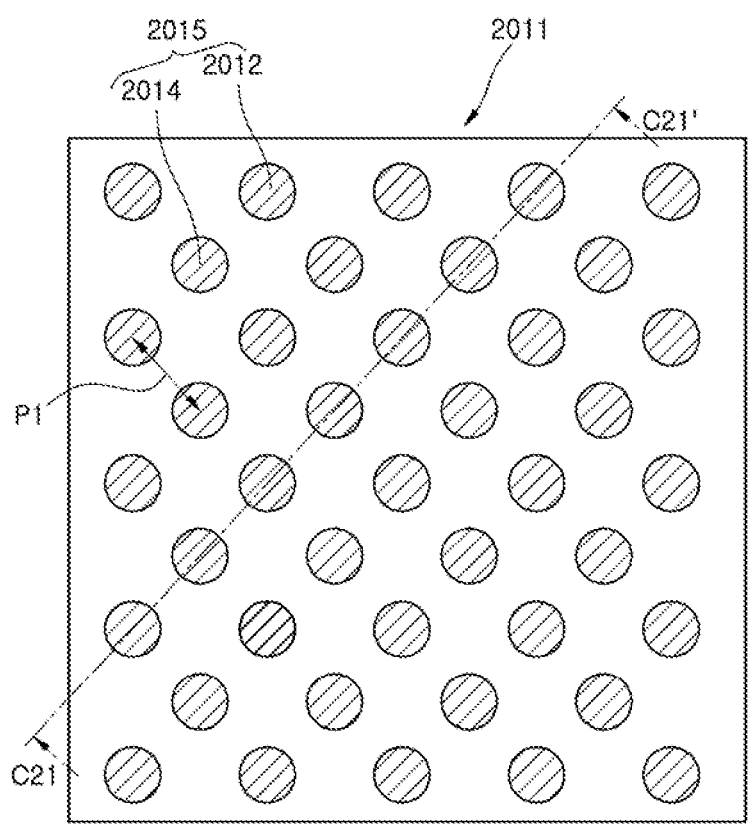
FIGS. 19 to 22 are plan views illustrating a process for obtaining a layout of a guide pattern used in a method of forming patterns according to another embodiment.

Referring to FIG. 19, a layout 2011 may include an array of first target features 2015 which are to be transferred onto the substrate to form patterns. The first target features 2015 may form fifth openings that penetrate a material layer disposed on the substrate. The first target features 2015 may be regularly and repeatedly arrayed to have a certain pitch, for example a first pitch P1. The first target features 2015 may include pillar features 2012 arrayed in a diagonal direction and first domain features 2014 disposed between the pillar features 2012.

Figure 20:
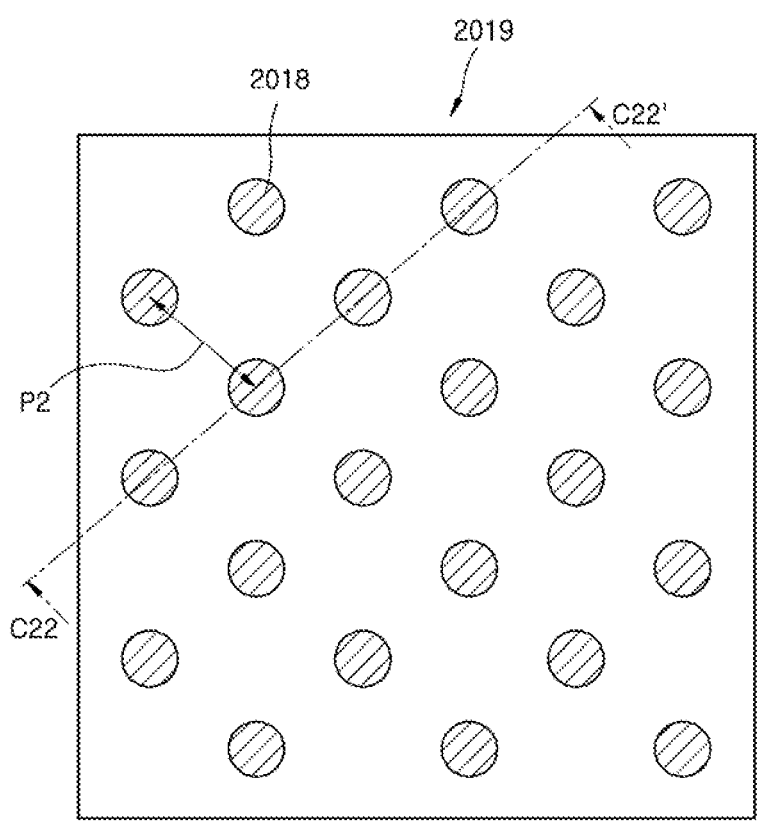

Referring to FIGS. 19 and 20, a layout 2019 may include an array of second target features 2018. The layout 2011 of the first target features 2015 shown in FIG. 19 and the layout 2019 of the second target features 2018 shown in FIG. 20 may be located at two different regions. For example, the layout 2011 and the layout 2019 may be adjacent to each other. The second target features 2018 may provide sixth openings that penetrate a material layer disposed on the substrate. Each of the second target features 2018 may have a size which is the same as or different from a size of each of the first target features 2015. While the first target features 2015 are arrayed to have the first pitch P1, the second target features 2018 may be arrayed to have a second pitch P2. The second pitch P2 may be greater than the first pitch P1. For example, the second pitch P2 may be twice or more of the first pitch P1.

Figure 21:
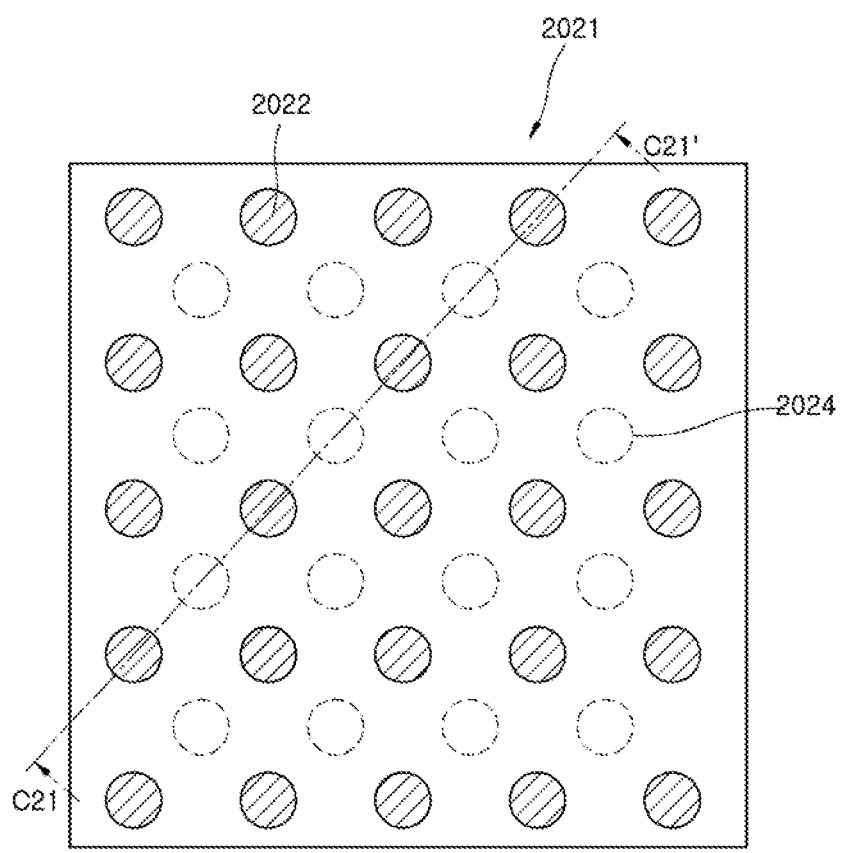

Referring to FIGS. 19 to 21, a layout 2021 may be obtained by separating the pillar features 2012 from the layout 2011 of the first target features 2015. That is, the layout 2021 may include pillar features 2022 corresponding to the pillar features 2012 without first domain features 2024 corresponding to the first domain features 2014.

Figure 22:
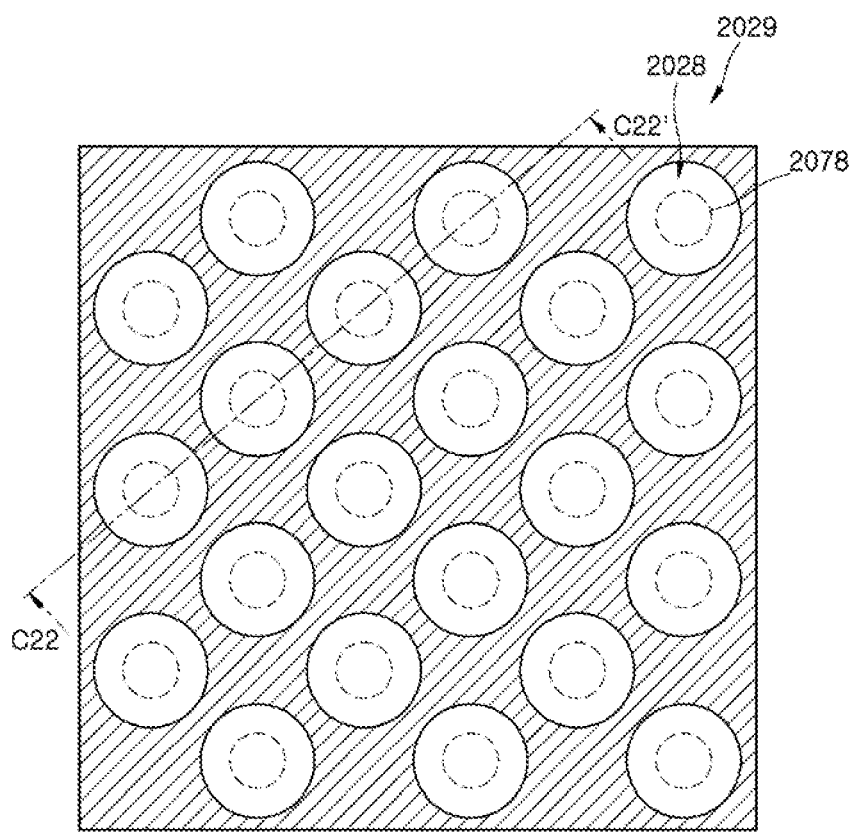

Referring to FIGS. 20 to 22, a layout 2029 may correspond to a layout of first opening features 2028 obtained by resizing the second target features 2018. Each of the first opening features 2028 may provide a space in which a third domain 2078 is induced. As a result, the second target features 2018 may be located at the positions of the third domains 2078, respectively.

FIGS. 23 to 50 are cross-sectional views and plan views illustrating a method of forming patterns according to another embodiment.

Figure 23:
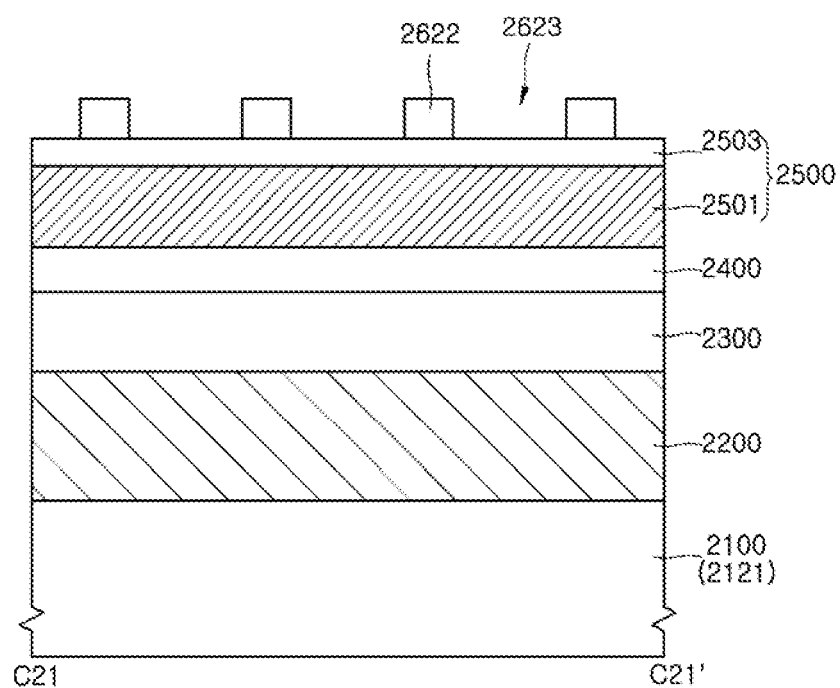
FIGS. 23 to 48 are cross-sectional views illustrating a method of forming patterns according to another embodiment.
Figure 24:
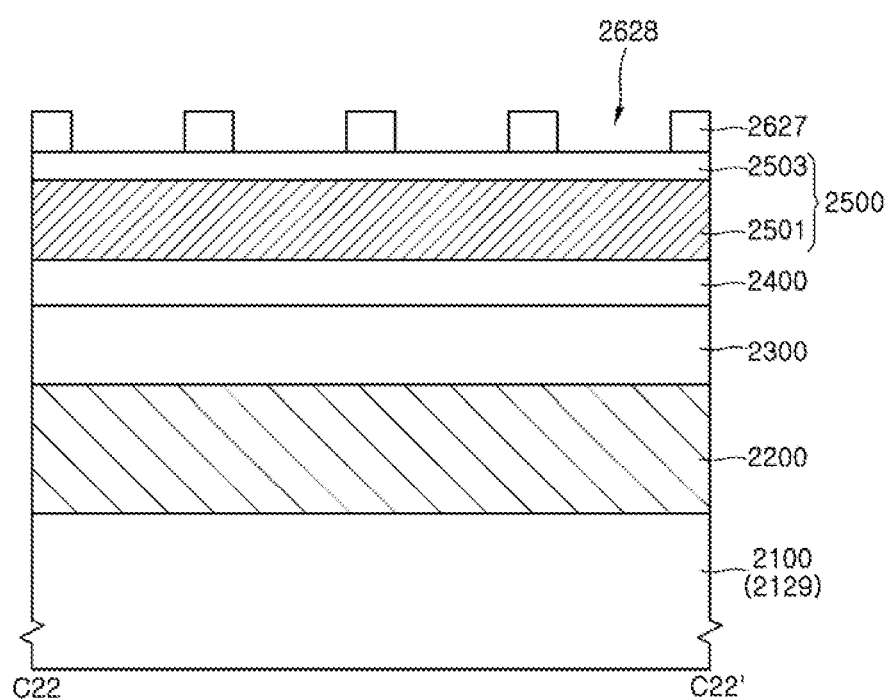

FIGS. 23 and 24 illustrate a step of forming mask patterns 2622 and 2627 on a guide layer 2500. FIG. 23 is a cross-sectional view taken along a line C21-C21' of FIG. 21, and FIG. 24 is a cross-sectional view taken along a line C22-C22' of FIG. 22.

Referring to FIGS. 21 to 24, a semiconductor substrate 2100 may have a first region 2121 and a second region 2129 that are distinct from each other, and the guide layer 2500 may be formed by sequentially stacking a SOC layer 2501 and a capping layer 2503 on an entire surface of the semiconductor substrate 2100. The capping layer 2503 may be formed of a silicon oxynitride (SiON) layer. The pillar features 2022 of the layout 2021 may be transferred onto the semiconductor substrate 2100 to realize the first mask patterns 2622 providing openings 2623 on the first region 2121, and the first opening features 2028 of the layout 2029 may be transferred onto the semiconductor substrate 2100 to realize the second mask patterns 2627 providing openings 2628 on the second region 2129. The first and second mask patterns 2622 and 2627 may include a photoresist material.

The guide layer 2500 may be patterned in a subsequent process to form guide patterns that define positions of domains in a phase-separated BCP layer. The guide layer 2500 may be formed on an underlying layer 2400 and may include an SOC layer having a thickness ranging from about 700 to about 800 angstroms. A capping layer (not shown) may be additionally formed on the SOC layer. The capping layer may be formed of a silicon oxynitride (SiON) layer having a thickness of about 300 angstroms.

The underlying layer 2400 may be used to pattern a portion or an entire hard mask in a subsequent patterning process. For example, the underlying layer 2400 may serve as one of multi-layers in a hard mask system. A second etch target layer 2300 may be formed between the underlying layer 2400 and the semiconductor substrate 2100. In addition, a first etch target layer 2200 may be formed between the second etch target layer 2300 and the semiconductor substrate 2100. The first or second etch target layer 2200 or 2300 may be one of the hard mask system, or may be selectively etched using the hard mask system as an etch mask in a subsequent process.

The first etch target layer 2200 may be formed of an interlayer insulation layer including a silicon oxide layer such as a tetra-ethyl-ortho-silicate (TEOS) layer having a thickness of about 2200 angstroms. Alternatively, the first etch target layer 2200 may be formed of a conductive layer such as a doped polysilicon layer. The second etch target layer 2300 may be formed by depositing an amorphous SOC layer having a thickness ranging from about 730 to about 1000 angstroms on the first etch target layer 2200. The underlying layer 2400 may be formed on the second etch target layer 2300 and may include a silicon oxynitride (SiON) layer having a thickness ranging from about 300 to about 350 angstroms.

Figure 25:
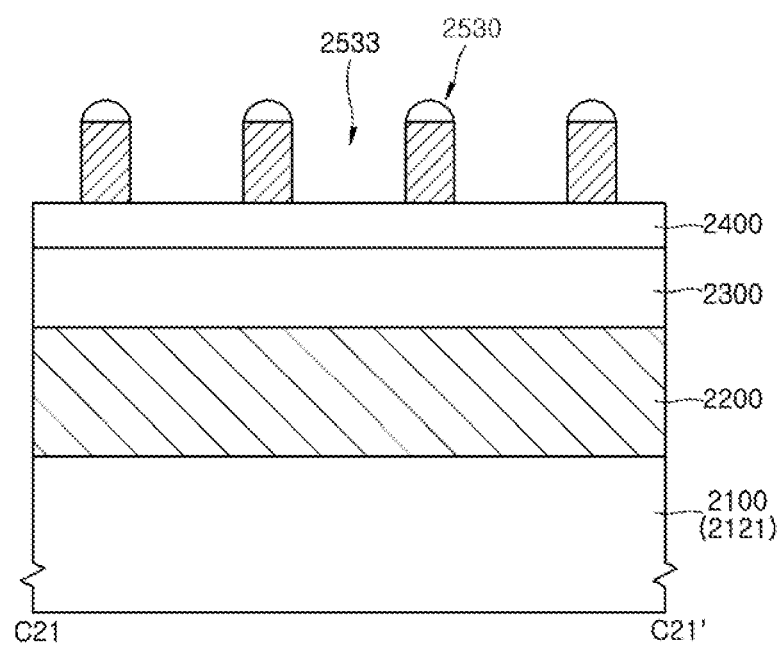
Figure 26:
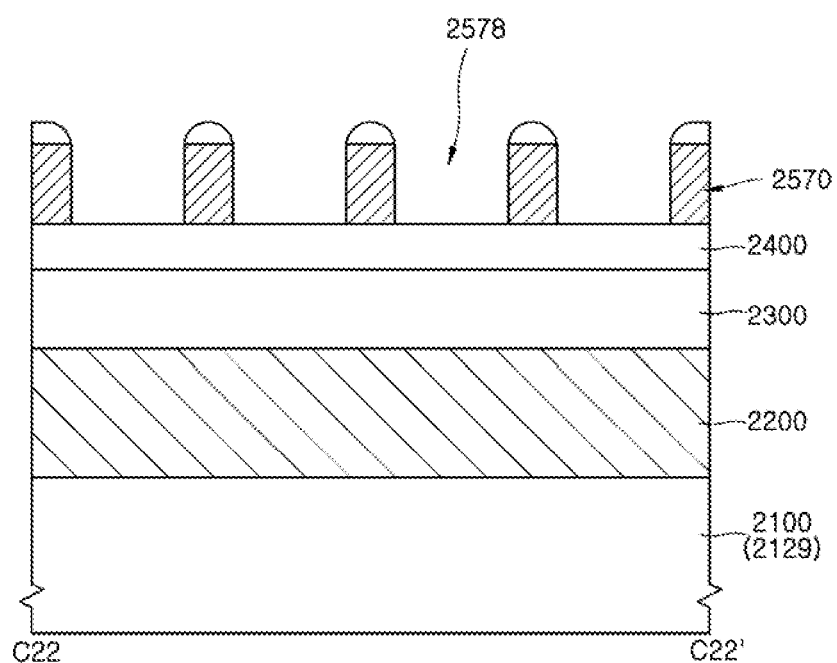

FIGS. 25 and 26 illustrate a step of forming an array of pillars 2530 and a template portion 2570. FIG. 25 is a cross-sectional view taken along a line C21-C21' of FIG. 21, and FIG. 26 is a cross-sectional view taken along a line C22-C22' of FIG. 22.

Referring to FIGS. 21 to 26, the guide layer 2500 may be etched using the mask patterns 2622 and 2627 as etch masks, thereby forming the array of the pillars 2530 having the same shape as the pillar features 2022 and the template portion 2570 providing first openings 2578 having the same shape as the first opening features 2028. The array of the pillars 2530 may be formed on the first region 2121 of the semiconductor substrate 2100, and the template portion 2570 may be formed on the second region 2129 of the semiconductor substrate 2100.

The pillars 2530 may be arrayed so that four adjacent pillars 2530 are positioned to form a rectangle shape. Alternatively, the pillars 2530 may be arrayed so that three adjacent pillars 2530 are positioned to form a triangular shape. The pillars 2530 may be arrayed to have a gap 2533 between two adjacent ones of the pillars 2530 which are disposed on a diagonal portion of the line C21-C21'. As illustrated in FIG. 21, a gap between two adjacent pillar features 2022 which are arrayed on a horizontal line may be narrower than the gap between two adjacent pillar features 2022 which are arrayed on the diagonal portion of the line C21-C21'. The pillars 2530 may serve as guide patterns that induce self-assembly of the BCP layer which is formed in a subsequent process.

The first openings 2578 in the template portion 2570 may have a pitch which is greater than a pitch of the pillars 2530. The template portion 2570 may also serve as a guide pattern that induces self-assembly of the BCP layer which is formed in a subsequent process.

Figure 27:
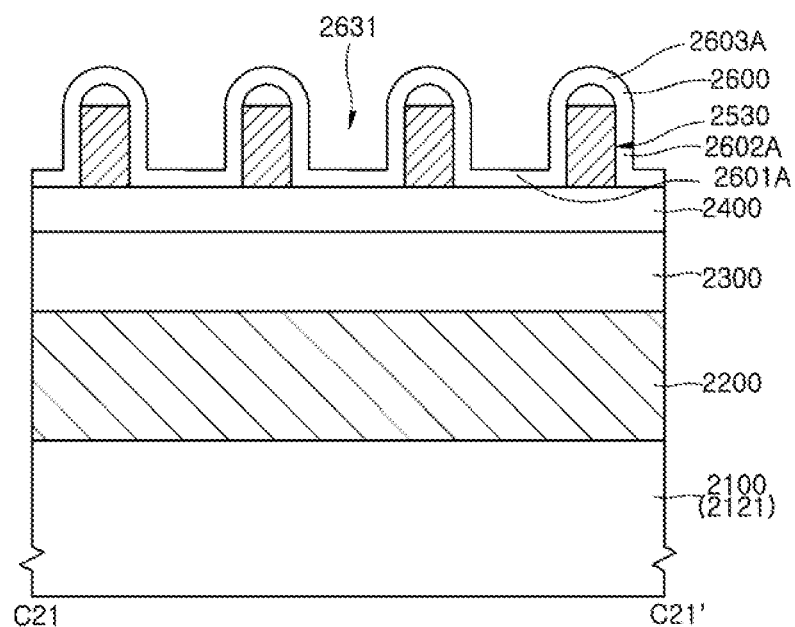
Figure 28:
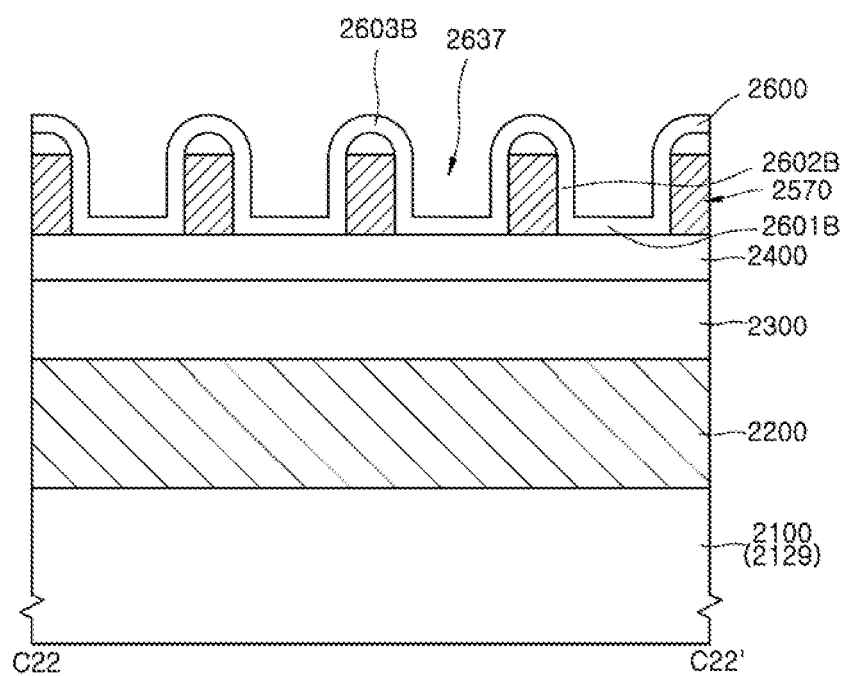

FIGS. 27 and 28 illustrate a step of forming a separation wall layer 2600. FIG. 27 is a cross-sectional view taken along a line C21-C21' of FIG. 21, and FIG. 28 is a cross-sectional view taken along a line C22-C22' of FIG. 22.

Referring to FIGS. 25 to 28, the separation wall layer 2600 may cover sidewalls of the pillars 2530, and sidewalls of the first openings 2578. The separation wall layer 2600 may include first separation wall portions 2602A covering sidewalls of the pillars 2530, a first extension 2601A extending from the first separation wall portions 2602A to cover a portion of the underlying layer 2400 exposed by the gaps 2533, and second extensions 2603A extending from the first separation wall portions 2602A to cover top surfaces of the pillars 2530. The separation wall layer 2600 may further include second separation wall portions 2602B covering sidewalls of the first openings 2578, third extensions 2601B extending from the second separation wall portions 2602B to cover portions of the underlying layer 2400 exposed by the first openings 2578, and a fourth extension 2603B extending from the second separation wall portions 2602B to cover a top surface of the template portion 2570.

The separation wall layer 2600 may provide recessed regions defined by gaps 2631 between the pillars 2530 and recessed regions defined by gaps 2637 in the first openings 2578. The separation wall layer 2600 may be formed of an insulation layer having an etch selectivity with respect to the pillars 2530 and the underlying layer 2400. For example, the separation wall layer 2600 may be formed of an ultra-low temperature oxide (ULTO) layer having a thickness of about 200 angstroms.

Figure 29:
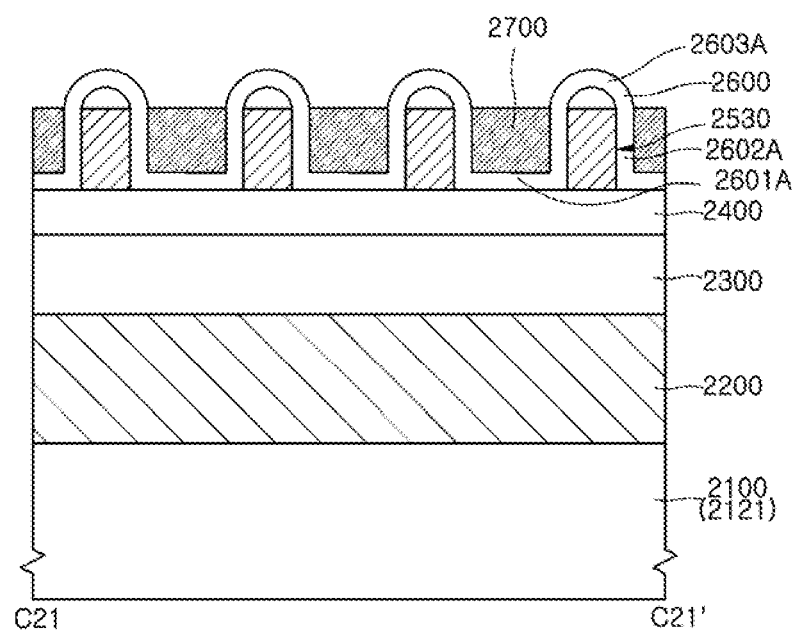
Figure 30:
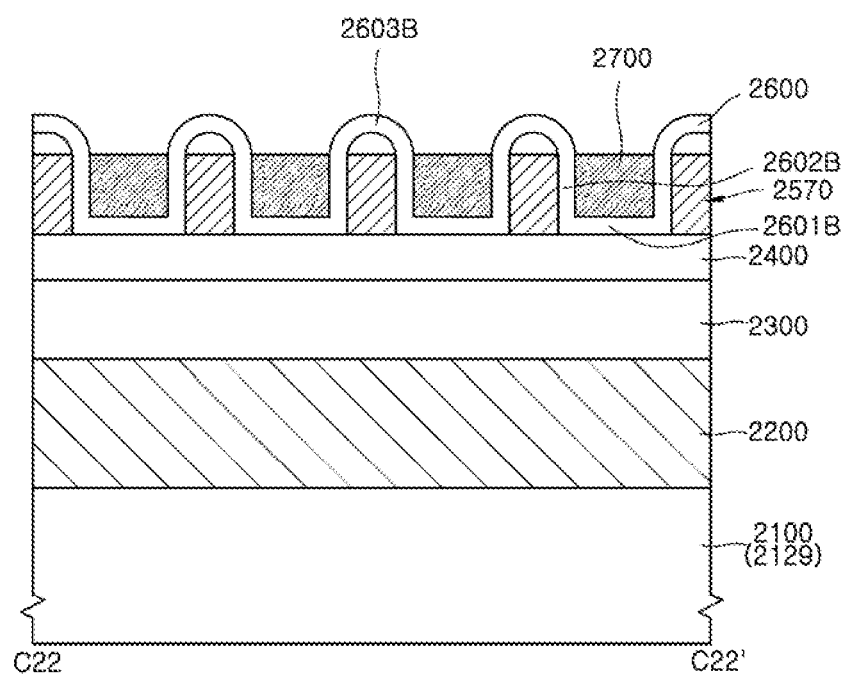

FIGS. 29 and 30 illustrate a step of forming the BCP layer 2700. FIG. 29 is a cross-sectional view taken along a line C21-C21' of FIG. 21, and FIG. 30 is a cross-sectional view taken along a line C22-C22' of FIG. 22.

Referring to FIGS. 29 and 30, the BCP layer 2700 may be formed on the separation wall layer 2600 to fill the gaps 2631 and 2637 which are provided by the pillars 2530 and the template portion 2570. The BCP layer 2700 may include a polystyrene-poly(meta methyl acrylate) block copolymer (PS-b-PMMA) material or a polystyrene-poly(di methyl siloxane) (PS-PDMS) block copolymer material. When the BCP layer 2700 is formed of the PS-b-PMMA material including PS blocks and PMMA blocks, a volume ratio of the PS blocks to the PMMA blocks may be controlled to be within the range from about 7:3 to about 5:5. The volume ratio of the PS blocks to the PMMA blocks or molecular weights of the PS block and the PMMA block may be appropriately controlled according to a process scheme. For example, the PS-b-PMMA material may have a PS block content of about 60 vol. % to about 80 vol. % and a PMMA block content of about 20 vol. % to about 40 vol. %.

Figure 31:
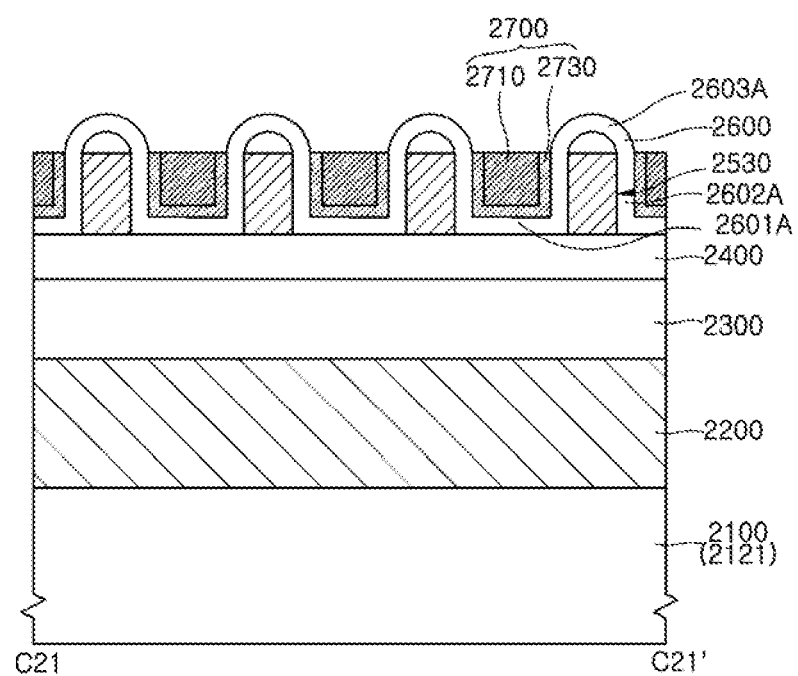
Figure 32:
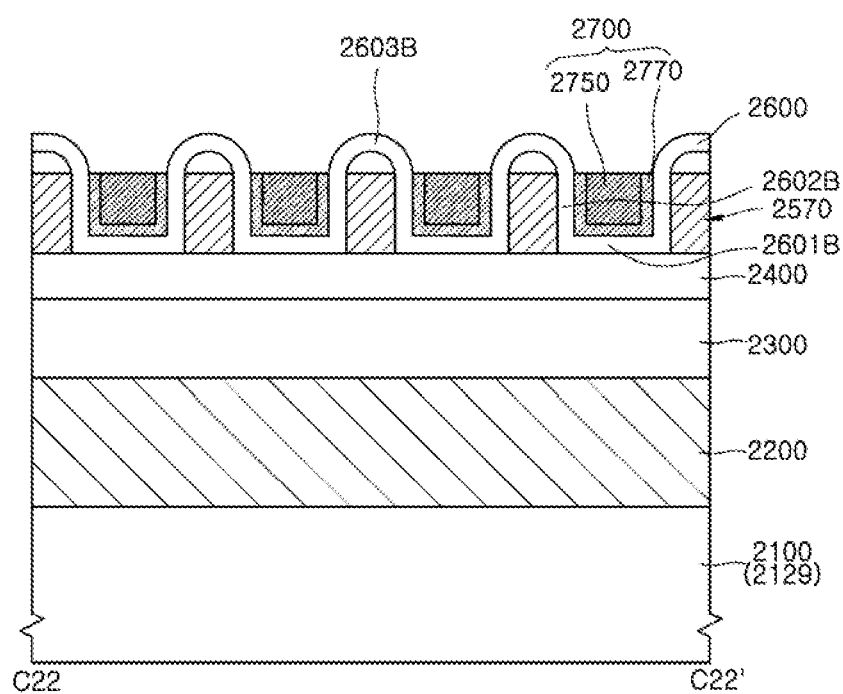

FIGS. 31 and 32 illustrate a step of phase-separating the BCP layer 2700. FIG. 31 is a cross-sectional view taken along a line C21-C21' of FIG. 21, and FIG. 32 is a cross-sectional view taken along a line C22-C22' of FIG. 22.

Referring to FIGS. 26 to 32, the BCP layer 2700 may be phase-separated through an annealing process into first domains 2710 respectively located at central portions of the gaps 2631 between the pillars 2530 arrayed on the line C21-C21', and a second domain 2730 disposed between the pillars 2530 to surround the first domains 2710 and to isolate the first domains 2710 from each other. The first domains 2710 may fill recessed regions provided by the second domain 2730. Thus, the first domains 2710 may have post shapes and may be surrounded by the second domain 2730.

When the BCP layer 2700 is phase-separated through an annealing process, portions of the BCP layer 700 filling the gaps 2637 provided by the separation wall layer 2600 on the second region 2129 may be phase-separated into third domains 2750 located at central portions of the gaps 2637 and fourth domains 2770 surrounding the third domain 2750 in the gap 2637. The third domains 2750 may be respectively located at the central portions of the gaps 2637, and the fourth domains 2770 may cover sidewalls of the first openings 2578.

The phase separation of the BCP layer 2700 may be achieved by annealing the BCP layer 2700 at a temperature exceeding a glass transition temperature Tg of the BCP layer 2700 to rearrange the polymer blocks of the BCP layer 2700. For example, the BCP layer 2700 may be annealed at a temperature ranging from about 100 to about 190 degrees Celsius for a time ranging from about six minutes to about twenty four hours to rearrange the polymer blocks of the BCP layer 2700.

Figure 33:
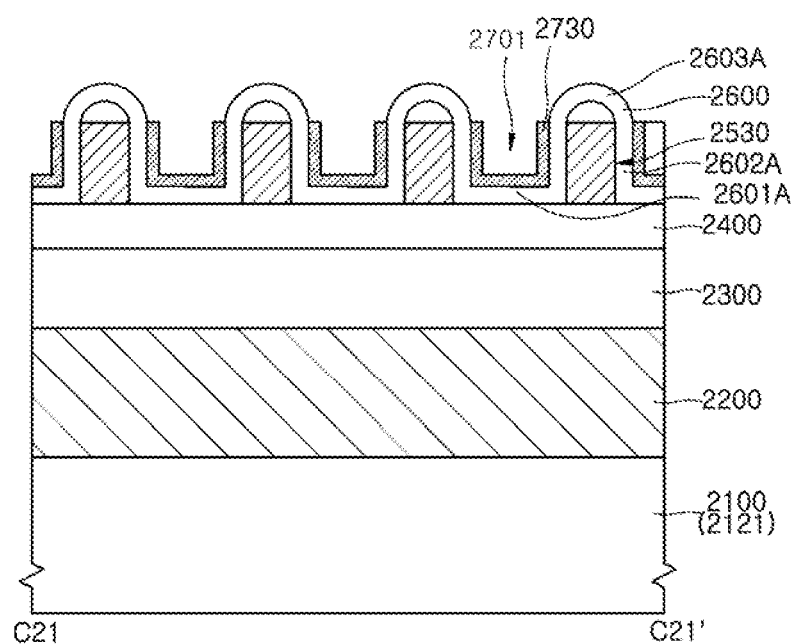
Figure 34:
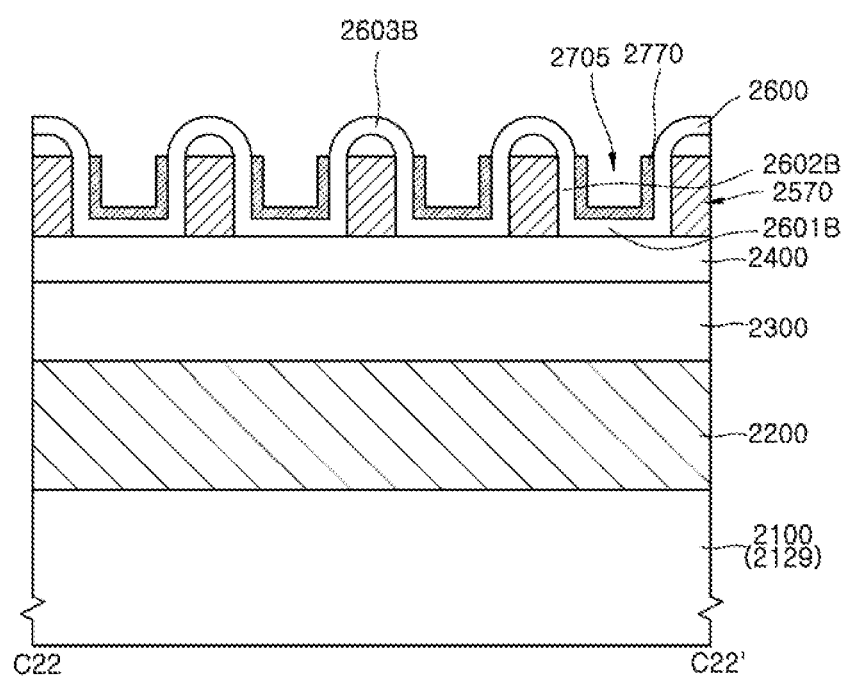

FIGS. 33 and 34 illustrate a step of forming a plurality of second openings 2701 and a plurality of third openings 2705. FIG. 33 is a cross-sectional view taken along a line C21-C21' of FIG. 21, and FIG. 34 is a cross-sectional view taken along a line C22-C22' of FIG. 22.

Referring to FIGS. 26 to 34, the first domains 2710 may be selectively removed to form the plurality of second openings 2701 located between the pillars 2530. When the first domains 2710 are selectively removed, the third domain 2750 may also be removed to form the third openings 2705 in the first openings 2578.

Figure 35:
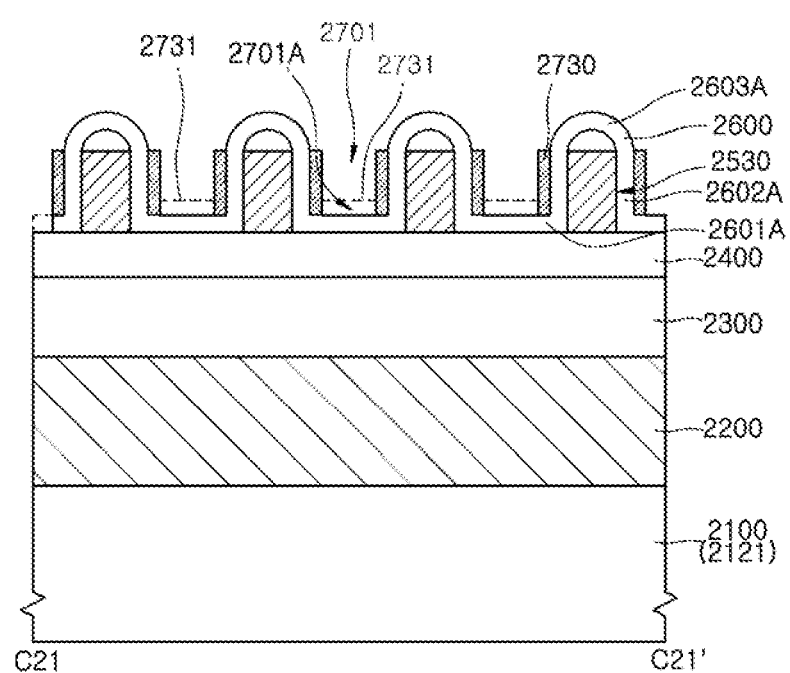
Figure 36:
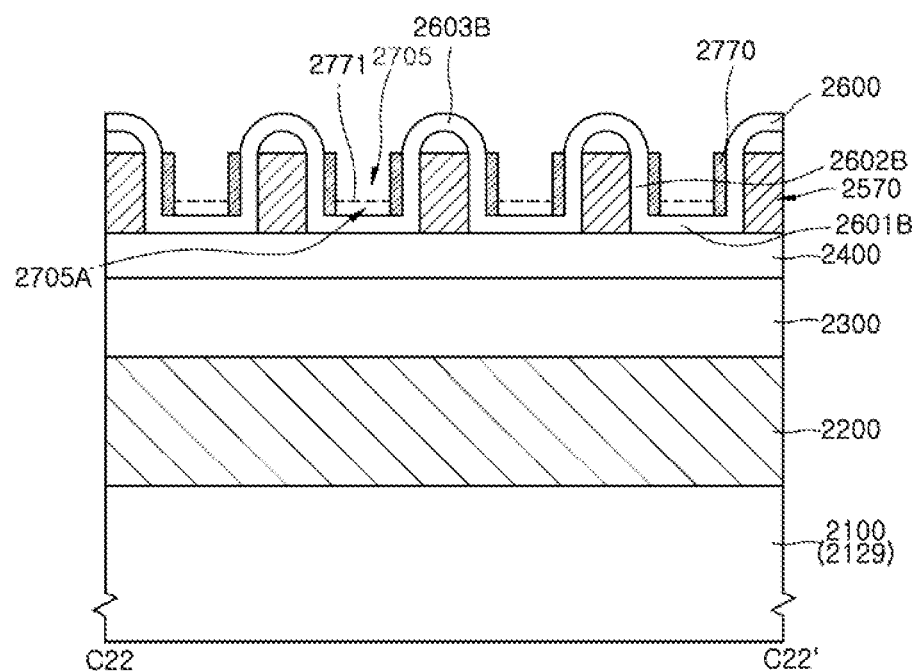

FIGS. 35 and 36 illustrate a step of forming first extensions 2701A of the second openings 2701 and first extensions 2705A of the third openings 2705. FIG. 35 is a cross-sectional view taken along a line C21-C21' of FIG. 21, and FIG. 36 is a cross-sectional view taken along a line C22-C22' of FIG. 22.

Referring to FIGS. 35 and 36, bottom portions 2731 of the second domains 2730 exposed by the second openings 2701 may be selectively removed to form the first extensions 2701A of the second openings 2701 extending from the second openings 2701. When the bottom portions 2731 of the second domains 2730 are selectively removed, bottom portions 2771 of the fourth domains 2770 exposed by the third opening 2705 may be also removed to form the first extensions 2705A of the third openings 2705.

Figure 37:
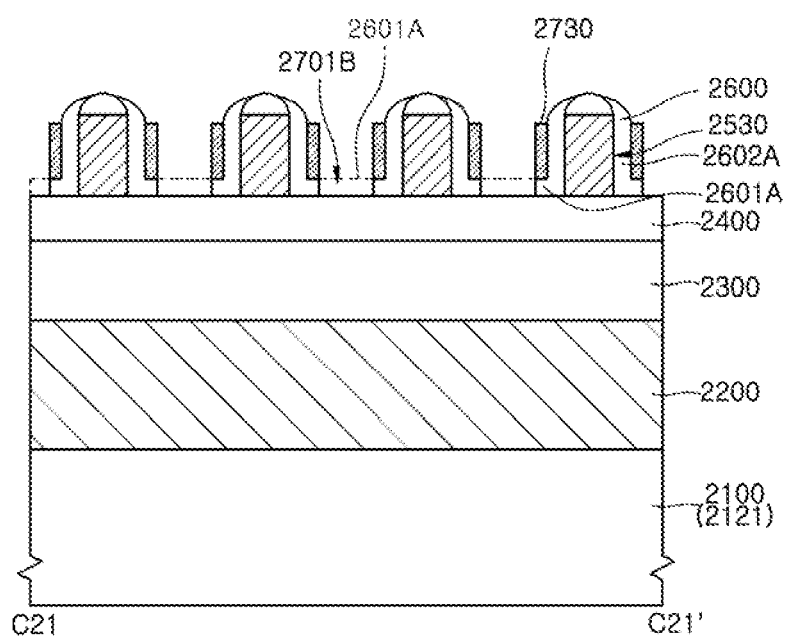
Figure 38:
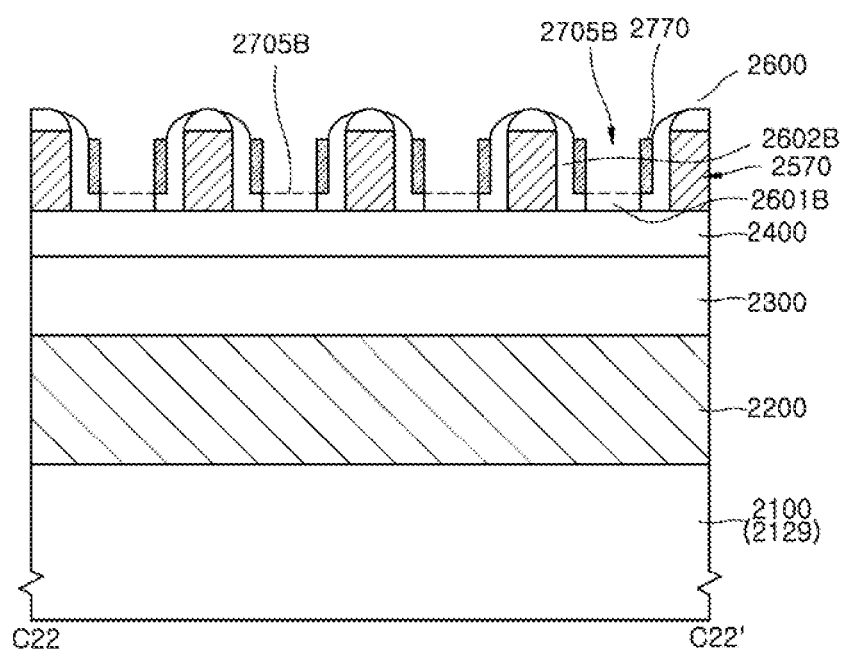

FIGS. 37 and 38 illustrate a step of forming second extensions 2701B of the second openings 2701 and second extensions 2705B of the third openings 2705. FIG. 37 is a cross-sectional view taken along a line C21-C21' of FIG. 21, and FIG. 38 is a cross-sectional view taken along a line C22-C22' of FIG. 22.

Referring to FIGS. 27 to 38, the first extensions 2601A of the separation wall layer 2600 exposed by the first extensions 2701A of the second openings 2701 may be selectively removed to form the second extensions 2701B of the second openings 2701 extending from the second openings 2701. When the first extensions 2601A of the separation wall layer 2600 are selectively removed, the third extensions 2601B of the separation wall layer 2600 may also be removed to form the second extensions 2705B of the third openings 2705. When the first extensions 2601A and the third extensions 2601B of the separation wall layer 2600 are selectively removed, the second and fourth extensions 2603A and 2603B of the separation wall layer 2600 may also be removed to expose the top surfaces of the pillars 2530 and the template portion 2570.

Figure 39:
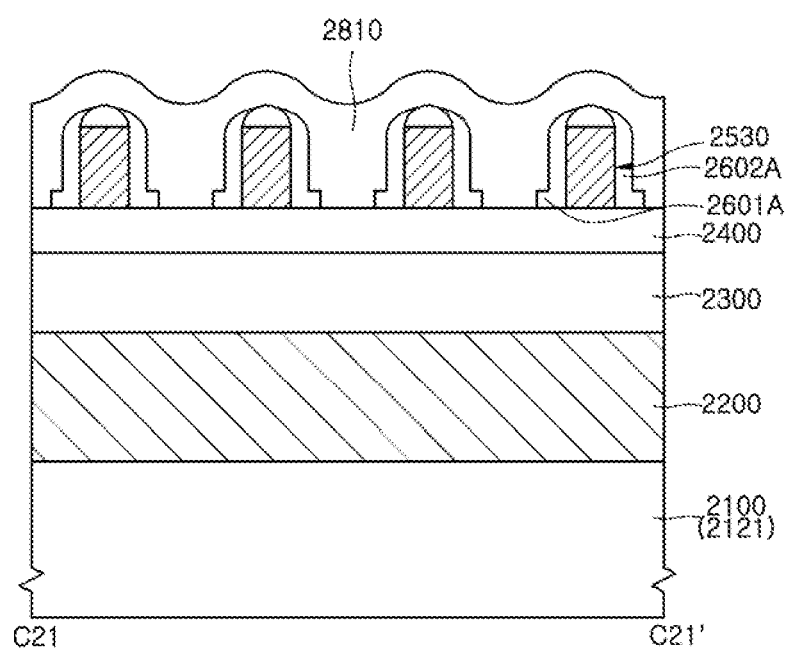
Figure 40:
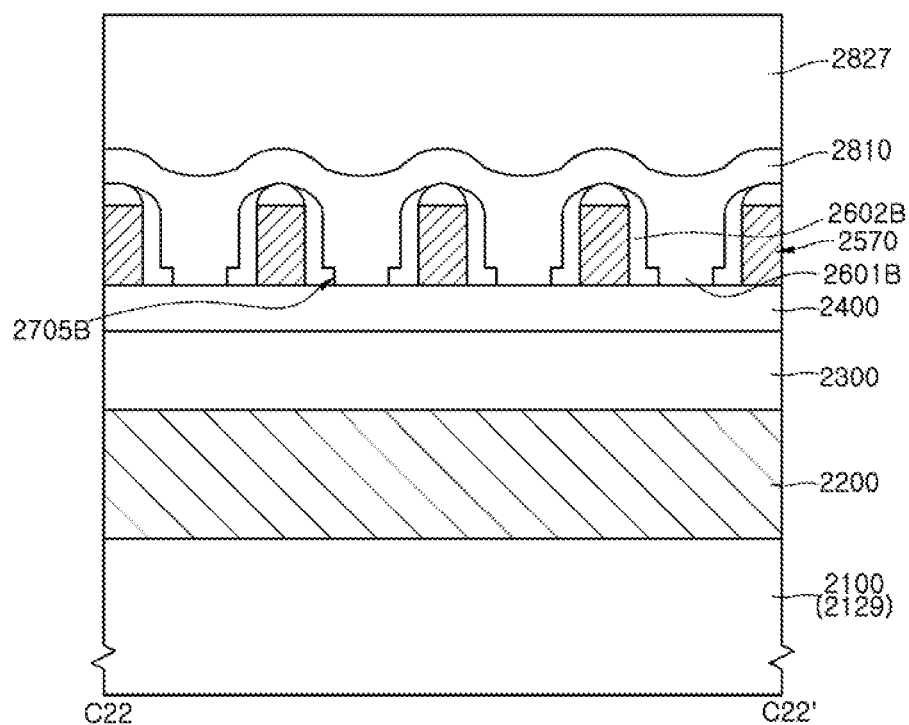

FIGS. 39 and 40 illustrate a step of forming a blocking pattern 2827. FIG. 39 is a cross-sectional view taken along a line C21-C21' of FIG. 21, and FIG. 40 is a cross-sectional view taken along a line C22-C22' of FIG. 22.

Referring to FIGS. 39 and 40, the blocking pattern 2827 may cover the template portion 2570 and the second extensions 2705B of the third openings 2705. The blocking pattern 2827 may correspond to a mask that opens the first region 2121 on which the pillars 2530 are arrayed and covers the second region 2129 on which the template portion 2570 is disposed. Before the blocking pattern 2827 is formed, residues of the BCP layer 2700 including the second domains 2730 and the fourth domains 2770 may be removed. After the residues of the BCP layer 2700 are removed, a sacrificial layer 2810 may be formed on the pillars 2530 and the template portion 2570 to fill the second extensions 27018B of the second openings 2701 and the second extensions 2705B of the third openings 2705. Subsequently, the sacrificial layer 2810 may be patterned to form the blocking pattern 2827 on the second region 2129 as well as a planarized sacrificial layer 2810 on the first region 2121. In some other embodiments, the blocking pattern 2827 may be formed of a different material from the planarized sacrificial layer 2810 after the planarized sacrificial layer 2810 is formed. In such a case, the blocking pattern 2827 may include a photoresist material, and the planarized sacrificial layer 2810 may include a bottom antireflective coating (BARC) material. In exemplary embodiments, the blocking pattern 2827 and the planarized sacrificial layer 2810 may be formed of two different dielectric layers having an etch selectivity with each other.

Figure 41:
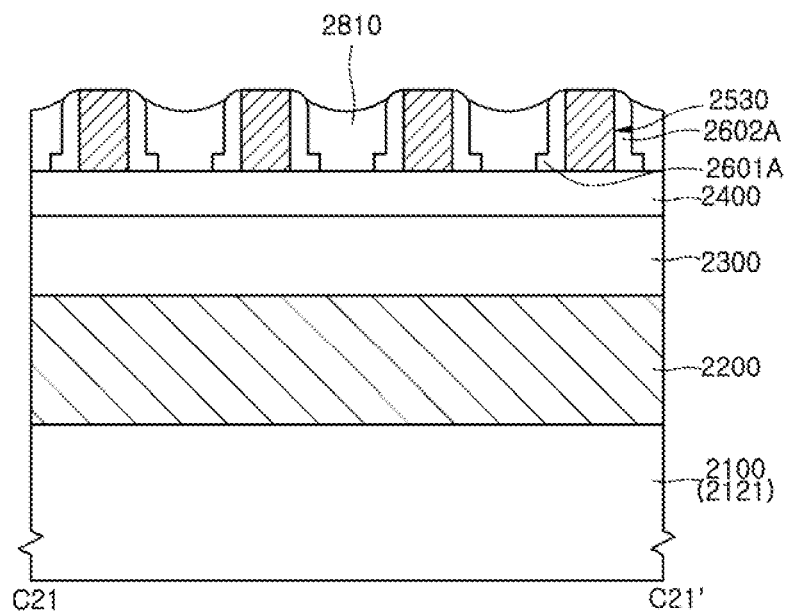
Figure 42:
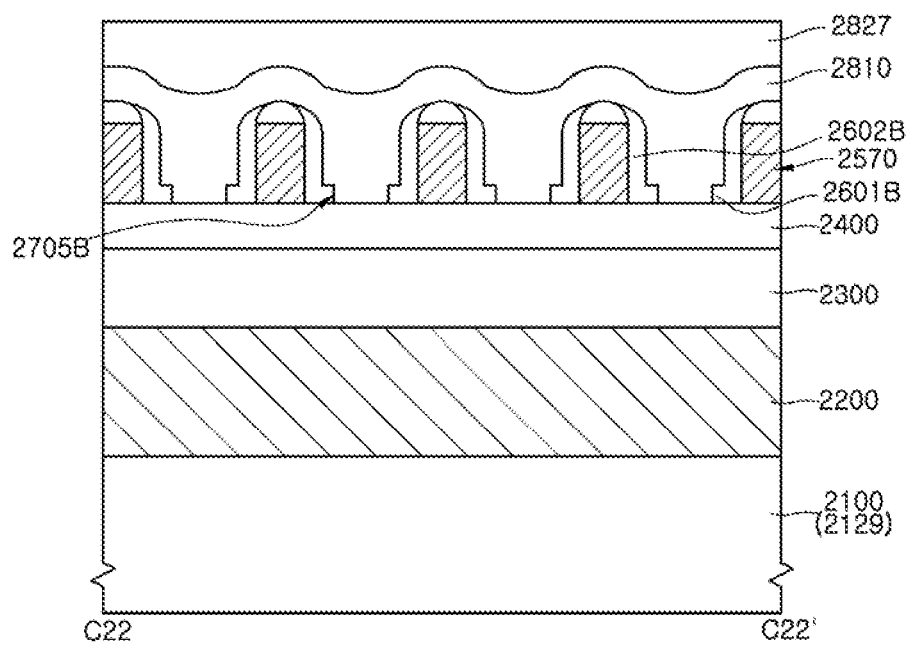

FIGS. 41 and 42 illustrate a step of exposing the top surfaces of the pillars 2530. FIG. 41 is a cross-sectional view taken along a line C21-C21' of FIG. 21, and FIG. 42 is a cross-sectional view taken along a line C22-C22' of FIG. 22.

Referring to FIGS. 41 and 42, the planarized sacrificial layer 2810 exposed by the blocking pattern 2827 may be partially etched to expose the top surfaces of the pillars 2530. Subsequently, capping patterns 2503 on the pillars 2530 may be removed to expose the pillars 2530.

Figure 43:
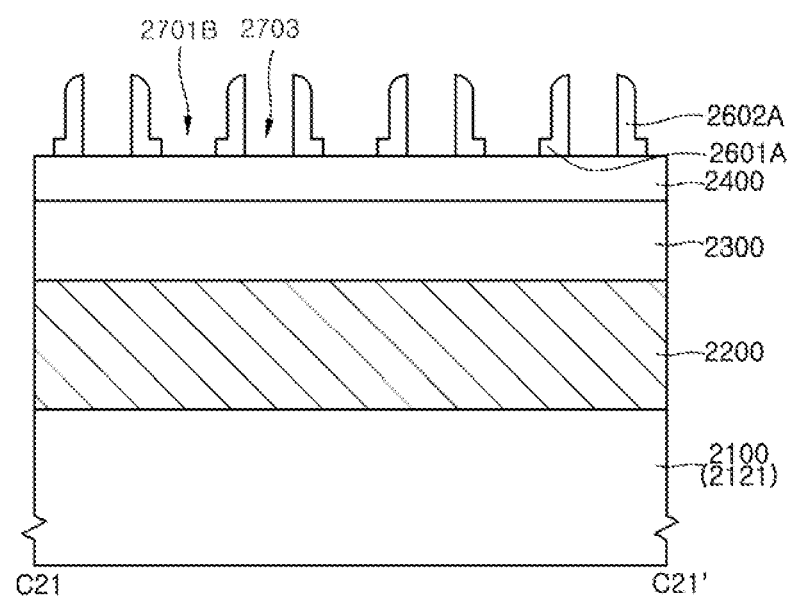
Figure 44:
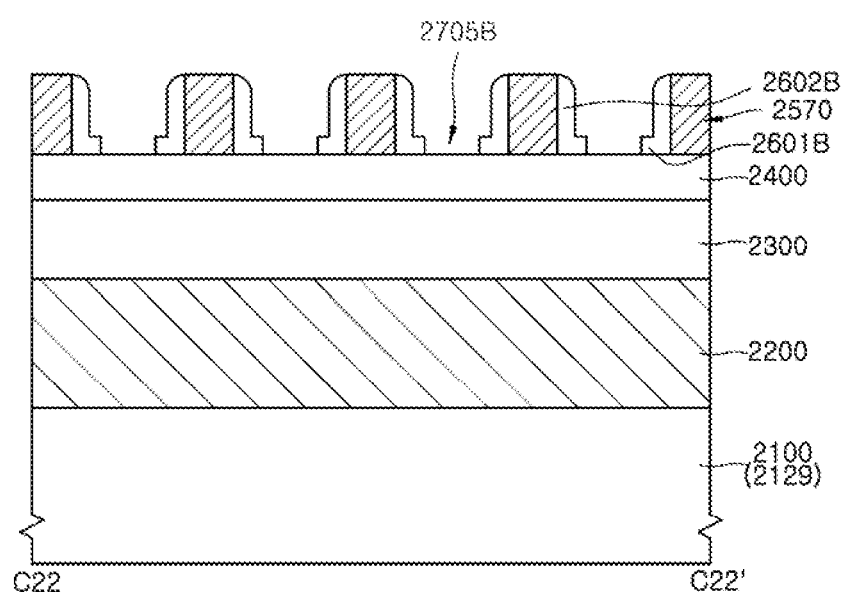

FIGS. 43 and 44 illustrate a step of removing the pillars 2530. FIG. 43 is a cross-sectional view taken along a line C21-C21' of FIG. 21, and FIG. 44 is a cross-sectional view taken along a line C22-C22' of FIG. 22.

Referring to FIGS. 43 and 44, the pillars 2530 may be selectively etched and removed using the planarized sacrificial layer 2810, the first separation wall portions 2602A, the first extensions 2601A, and the blocking pattern 2827 as etch mask. The pillars 2530 may be removed to form fourth openings 2703. Subsequently, the blocking pattern 2827 and the planarized sacrificial layer 2810 may be selectively removed.

Figure 45:
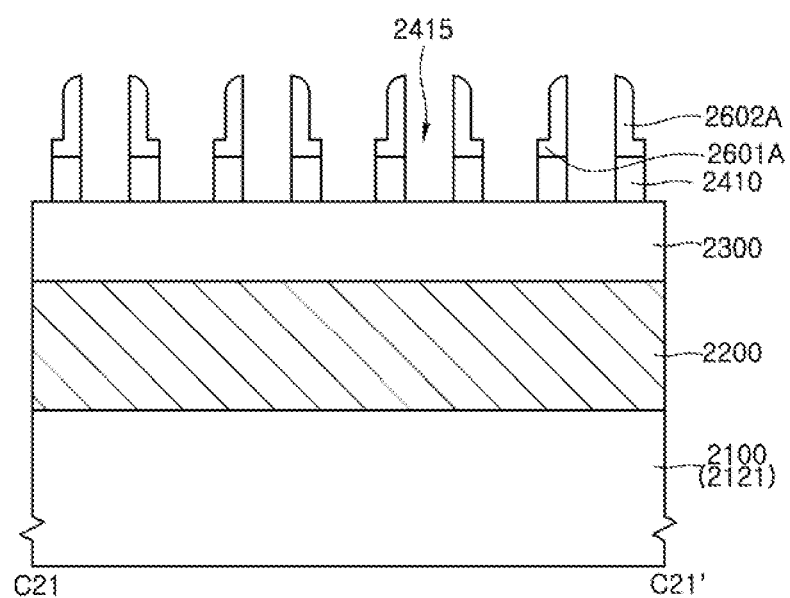
Figure 46:
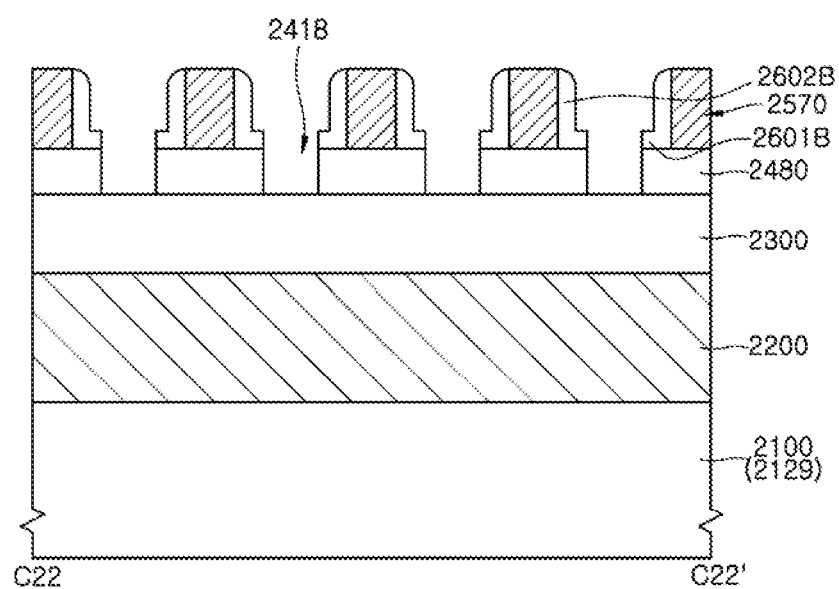

FIGS. 45 and 46 illustrate a step of forming fifth openings 2415 and sixth openings 2418. FIG. 45 is a cross-sectional view taken along a line C21-C21' of FIG. 21, and FIG. 46 is a cross-sectional view taken along a line C22-C22' of FIG. 22.

Referring to FIGS. 45 and 46, the underlying layer 2400 on the first region 2121 may be etched using the first separation wall portions 2602A and the first extensions 2601A as etch masks, thereby forming the fifth openings 2415 that extend from the second extensions 2701B of the second openings 701 and extend from the fourth openings 2703. The underlying layer 2400 may be patterned to include a first pattern 2410 that provides the fifth openings 2415.

In addition, the underlying layer 2400 on the second region 2129 may be etched using the template portion 2570, the second separation wall portion 2602B and the third extension 2601B as etch masks, thereby forming the sixth openings 2418 that extend from the second extensions 2705B of the third openings 2705. Accordingly, the underlying layer 2400 may be patterned to include a second pattern 2480 that provides the sixth openings 2418. The fifth openings 2415 and the sixth opening 2418 may be simultaneously formed.

Figure 47:
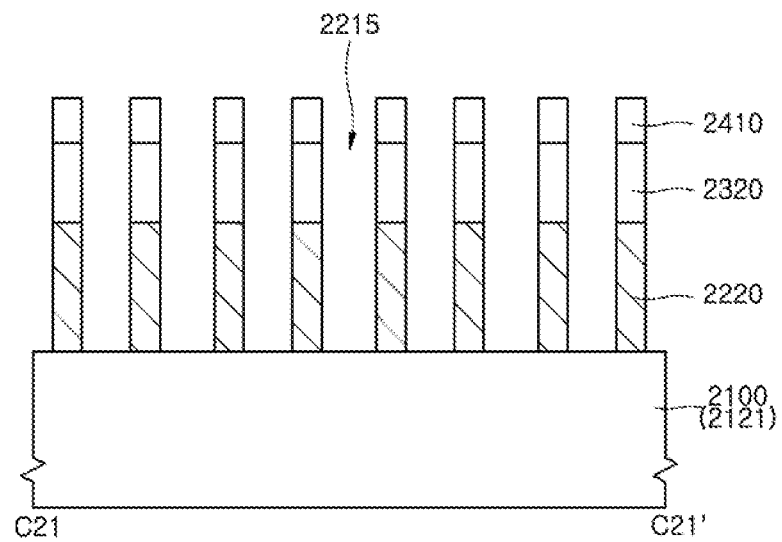
Figure 48:
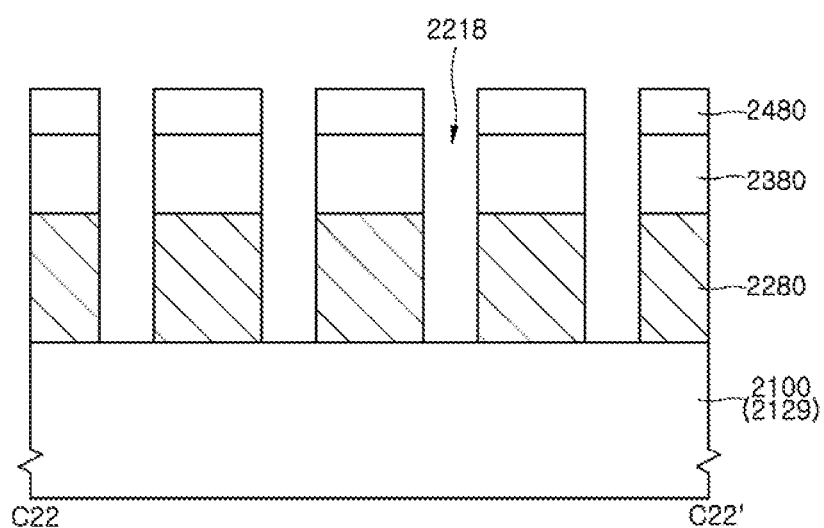

FIGS. 47 and 48 illustrate a step of forming extensions 2215 of the fifth openings 2415 and extensions 2218 of the sixth openings 2418. FIG. 47 is a cross-sectional view taken along a line C21-C21' of FIG. 21, and FIG. 48 is a cross-sectional view taken along a line C22-C22' of FIG. 22.

Referring to FIGS. 19 to 48, the second etch target layer 2300 and the first etch target layer 2200 may be etched using the first pattern 2410 and the second pattern 2480 as etch masks, thereby forming the extensions 2215 of the fifth openings 2415 and the extensions 2218 of the sixth openings 2418 that penetrate the first and second etch target layers 2200 and 2300. As a result, a first pattern 2320 of the second etch target layer 2300 and a first pattern 2220 of the first etch target layer 2200 may be provided by the extensions 2215 of the fifth openings 2415 on the first region 2121, and a second pattern 2380 of the second etch target layer 2300 and a second pattern 2280 of the first etch target layer 2200 may be provided by the extensions 2218 of the sixth openings 2418 on the second region 2129. Accordingly, each of the extensions 2215 of the fifth openings 2415 may penetrate the first and second etch target layers 2200 and 2300 and have the same shape as the first target feature 2015, and each of the extensions 2218 of the sixth openings 2418 may penetrate the first and second etch target layers 2200 and 2300 and have the same shape as the second target feature 2018.

Figure 49:
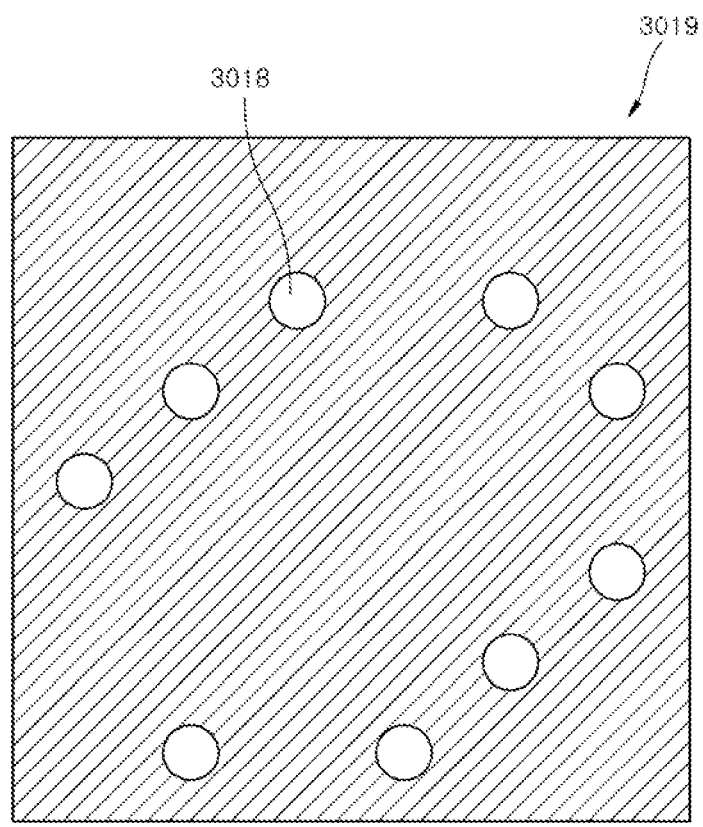
FIGS. 49 and 50 are plan views illustrating a process for obtaining a layout of a guide pattern used in a method of forming patterns according to still another embodiment.
Figure 50:
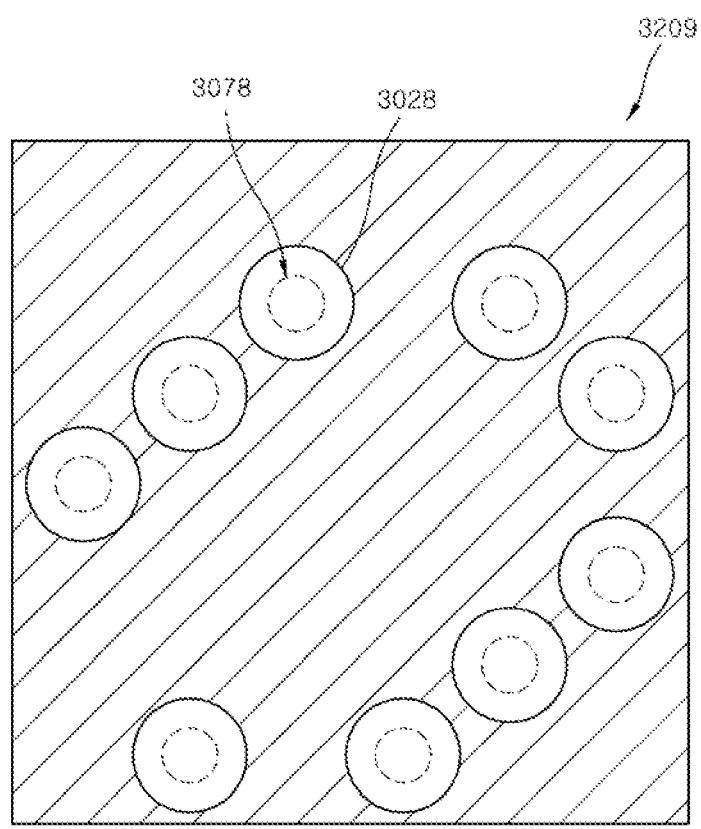

FIGS. 49 and 50 are plan views illustrating a process for obtaining a layout of a guide pattern used in a method of forming patterns according to still another embodiment.

Referring to FIGS. 20 to 50, a layout 3019 may be set to include an array of third target features 3018. While the second target features 2018 are regularly arrayed, the third target features 3018 may be irregularly arrayed. A layout 3029 of FIG. 50 may correspond to a layout of first opening features 3028 that are obtained by resizing the third target features 3018 of FIG. 49. Each of the first opening features 3028 may provide a space in which a third domain 3078 is induced. As a result, the third target features 3018 may be located at the positions of the third domains 3078, respectively. The method of forming patterns described with reference to FIGS. 23 to 48 may also be used in realization of the third target features 3018 which are irregularly arrayed.

According to the embodiments described above, nano-scale structures or nano structures can be fabricated on a large-sized substrate through a phase separation technique of a BCP layer. The nano-scale structures may be used in fabrication of polarizing plates or in formation of reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Furthermore, the nano structures may be used in molding processes for fabricating nanowire transistors or memories, molding processes for fabricating electronic/electric components such as nano-scaled interconnections, molding process for fabricating catalysts of solar cells and fuel cells, molding process for fabricating etch masks and organic light emitting diodes (OLEDs), and molding process for fabricating gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

The embodiments of the present disclosure have been disclosed above for illustrative purposes. Those skilled in the art will appreciate that various modifications, additions, and substitutions are possible, without departing from the scope and spirit of the present disclosure as disclosed in the accompanying claims.

What is claimed is:

1. A method of forming patterns, the method comprising:
   forming an array of pillars and a template portion to provide first openings on an underlying layer;
   forming a separation wall layer including separation wall portions that cover sidewalls of the pillars and sidewalls of the first openings;
   forming a block copolymer layer on the separation wall layer;
   forming first domains in gaps between the pillars, forming second domains surrounding and separating the first domains, forming third domains in the first openings, and forming fourth domains surrounding the third domains, by annealing the block copolymer layer;
   forming second openings in the gaps between the pillars, and forming third openings in the first openings, by selectively removing the first domains and the third domains;
   forming fourth openings by selectively removing the pillars; and
   forming fifth openings that penetrate the underlying layer and extend from the second and fourth openings, and forming sixth openings that penetrate the underlying layer and extend from the third openings.

2. The method of claim 1, wherein the separation wall layer is formed to further include an extension that extends from the separation wall portions to cover a portion of the underlying layer adjacent to the pillars.

3. The method of claim 2, wherein the second domain and the fourth domains are formed to cover the extension of the separation wall layer to have concave shapes surrounding sidewalls and bottom surfaces of the first domains and the third domains.

4. The method of claim 3, wherein the forming of the fifth openings and the sixth openings includes:
   forming first extensions of the second openings, and forming first extensions of the third openings, by selectively removing bottom portions of the second and fourth domains exposed by the second and third openings; and
   forming second extensions of the second openings, and forming second extensions of the third openings, by selectively removing the extensions of the separation wall layer exposed by the first extensions of the second and third openings.

5. The method of claim 4, wherein the forming of the fifth openings and the sixth openings further includes:
   forming the fifth openings by selectively etching portions of the underlying layer exposed by the second extensions of the second and fourth openings; and forming the sixth openings by selectively etching portions of the underlying layer exposed by the second extensions of the third openings.

6. The method of claim 1, wherein the forming of the array of the pillars and the template portion includes:
obtaining a layout of first target features providing the fifth openings and a layout of second target features providing the sixth openings;
separating the layout of the first target features into a layout of the pillars and a layout of the first domains; and
forming the pillars using the layout of the pillars.

7. The method of claim 6, wherein the forming of the array of the pillars and the template portion further includes obtaining a layout of the first openings by resizing the second target features.

8. The method of claim 1, wherein the forming of the fourth openings includes:
forming a blocking pattern opening a region in which the pillars are arrayed, and covering the template portion and the third openings; and
selectively etching the pillars using the blocking pattern and the separation wall portions as etch masks.

9. The method of claim 8, wherein the forming of the blocking pattern includes:
forming a sacrificial layer that fills the third openings and the second openings;
forming on the sacrificial layer an etch mask covering the template portion and the third openings, and opening the region in which the pillars are arrayed; and
exposing top surfaces of the pillars by selectively removing a portion of the sacrificial layer exposed by the etch mask.

10. The method of claim 9,
wherein the etch mask is formed to include a photoresist material, and
wherein the sacrificial layer includes a bottom antireflective coating (BARC) material.

11. The method of claim 1, wherein the fifth openings have a pitch different from a pitch of the sixth openings.

12. The method of claim 1,
wherein the fifth openings are regularly arrayed as compared with the sixth openings, and
wherein the sixth openings are irregularly arrayed as compared with the fifth openings.

13. The method of claim 1, wherein the first openings have a width different from a width of the pillars.

14. The method of claim 1, wherein the first openings have a width greater than a width of the pillars.

15. The method of claim 1, wherein the pillars serve as guide patterns that induce each of the first domains to a central portion of four adjacent pillars.

16. The method of claim 1, wherein the pillars serve as guide patterns that induce each of the first domains to a central portion of three adjacent pillars.

17. The method of claim 1,
wherein the forming of the first to fourth domains includes phase-separating the block copolymer layer into first polymer blocks and second polymer blocks by the annealing of the block copolymer layer, and
wherein the first polymer blocks are ordered to form the first and third domains, and the second polymer blocks are ordered to form the second and fourth domains during the annealing of the block copolymer layer.

18. The method of claim 17, wherein the block copolymer layer includes a polystyrene-poly (meta methyl acrylate) block copolymer (PS-b-PMMA) material.

* * * * *